(12) United States Patent
Tamura et al.

(10) Patent No.: US 11,195,941 B2
(45) Date of Patent: Dec. 7, 2021

(54) SEMICONDUCTOR DEVICE

(71) Applicant: FUJI ELECTRIC CO., LTD., Kanagawa (JP)

(72) Inventors: Takahiro Tamura, Matsumoto (JP); Michio Nemoto, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 121 days.

(21) Appl. No.: 16/589,127

(22) Filed: Sep. 30, 2019

(65) Prior Publication Data

US 2020/0035817 A1 Jan. 30, 2020

Related U.S. Application Data

(63) Continuation of application No. PCT/JP2018/038213, filed on Oct. 12, 2018.

(30) Foreign Application Priority Data

Oct. 18, 2017 (JP) .............................. JP2017-201826

(51) Int. Cl.
| | | |
|---|---|---|
| *H01L 29/739* | (2006.01) | |
| *H01L 27/06* | (2006.01) | |
| *H01L 29/06* | (2006.01) | |
| *H01L 29/10* | (2006.01) | |
| *H01L 29/861* | (2006.01) | |

(52) U.S. Cl.
CPC ...... *H01L 29/7397* (2013.01); *H01L 27/0664* (2013.01); *H01L 29/0611* (2013.01); *H01L 29/1095* (2013.01); *H01L 29/8613* (2013.01)

(58) Field of Classification Search
CPC ............. H01L 29/7397; H01L 27/0664; H01L 29/0611; H01L 29/1095; H01L 29/8613;
(Continued)

(56) References Cited

U.S. PATENT DOCUMENTS

2009/0001411 A1 1/2009 Tokura
2015/0109050 A1 4/2015 Pfirsch
(Continued)

FOREIGN PATENT DOCUMENTS

JP 2009021557 A 1/2009
JP 2014220519 A 11/2014
(Continued)

OTHER PUBLICATIONS

Office Action issued for counterpart Japanese Application No. 2019-549253, issued by the Japan Patent Office dated Jun. 9, 2020 (drafted on Jun. 4, 2020).
(Continued)

*Primary Examiner* — Su C Kim

(57) ABSTRACT

Provided is a semiconductor device including a semiconductor substrate having a drift region; a transistor portion having a collector region; a diode portion having a cathode region; and a boundary portion arranged between the transistor portion and the diode portion at an upper surface of the semiconductor substrate, and having the collector region, wherein the mesa portion of each of the transistor portion and the boundary portion has an emitter region and a base region, the base region has a channel portion, and a density in the upper surface of the mesa portion in the region in which the channel portion is projected onto the upper surface of the mesa portion of the boundary portion may be smaller than the density of the region in which the channel portion is projected onto the upper surface of the mesa portion of the transistor portion.

20 Claims, 25 Drawing Sheets

(58) Field of Classification Search
CPC ............. H01L 29/4238; H01L 29/0834; H01L 29/404; H01L 29/0696; H01L 27/0629; H01L 29/861; H01L 29/0692; H01L 29/407; H01L 29/167; H01L 29/32; H01L 21/76
See application file for complete search history.

(56) References Cited

U.S. PATENT DOCUMENTS

2016/0141400 A1* 5/2016 Takahashi ........... H01L 29/0834
257/140
2016/0211257 A1 7/2016 Yoshida
2017/0250269 A1 8/2017 Sumitomo

FOREIGN PATENT DOCUMENTS

| JP | 2016029710 A | 3/2016 |
|---|---|---|
| JP | 2016096222 A | 5/2016 |
| JP | 2016131224 A | 7/2016 |
| JP | 2016174029 A | 9/2016 |
| JP | 2017168579 A | 9/2017 |

OTHER PUBLICATIONS

International Search Report and (ISA/237) Written Opinion of the International Search Authority for International Patent Application No. PCT/JP2018/038213, mailed by the Japan Patent Office dated Jan. 8, 2019.

* cited by examiner

SEMICONDUCTOR DEVICE

The contents of the following Japanese patent applications are incorporated herein by reference:
NO. 2017-201826 filed in JP on Oct. 18, 2017, and
NO. PCT/JP2018/038213 filed on Oct. 12, 2018.

BACKGROUND

1. Technical Field

The present invention relates to a semiconductor device.

2. Related Art

Conventionally, there is known a semiconductor device in which a transistor such as an insulated gate bipolar transistor (IGBT) and the like, and a diode such as a freewheeling diode (FWD) are formed on the same semiconductor substrate (see, for example, Patent Literature 1).
Patent Literature 1: JP 2016-131224 A

SUMMARY

The semiconductor device preferably has good characteristics of withstand voltage and the like.

In order to solve the above problems, according to a first aspect of the present invention, there is provided a semiconductor device including a semiconductor substrate having a drift region of a first conductivity type. The semiconductor device may include a transistor portion formed on the semiconductor substrate and having a collector region of a second conductivity type. The semiconductor device may include a diode portion formed on the semiconductor substrate and having a cathode region of the first conductivity type. The semiconductor device may include a boundary portion formed on the semiconductor substrate, arranged between the transistor portion and the diode portion, and having a collector region at the upper surface of the semiconductor substrate. Each of the transistor portion and the boundary portion may have a trench portion having a longitudinal direction at the upper surface of the semiconductor substrate, and including one or more gate trench portions provided from the upper surface of the semiconductor substrate to the inside of the semiconductor substrate. Each of the transistor portion and the boundary portion may have a mesa portion sandwiched between two trench portions. The mesa portion of the transistor portion and the boundary portion may have an emitter region having a doping concentration higher than that of the drift region may be provided. The mesa portion of the transistor portion and the boundary portion may have a base region of the second conductivity type which is provided between the drift region and the upper surface of the semiconductor substrate. The base region may have a channel portion which is a portion in which the base region is in contact with the gate trench portion in the mesa portion which is provided with an emitter region on the upper surface of the semiconductor substrate. A density in the upper surface of the mesa portion in the region in which the channel portion is projected onto the upper surface of the mesa portion of the boundary portion may be smaller than the density of the region in which the channel portion is projected onto the upper surface of the mesa portion of the transistor portion.

The emitter regions and regions of the second conductivity type may be alternately arranged along the longitudinal direction of the trench portion at the upper surface of the mesa portion of the transistor portion and the boundary portion. A length of the region of the second conductivity type of the boundary portion in the longitudinal direction of the trench portions may be larger than a length of the region of the second conductivity type of the transistor portion in the longitudinal direction of the trench portions.

A length of the one emitter region of the transistor portion in the longitudinal direction of the trench portions may be identical to length of the one emitter region of the boundary portion in the longitudinal direction of the trench portions. A length of the emitter region of the boundary portion in the longitudinal direction of the trench portions may be smaller than a length of the emitter region of the transistor portion in the longitudinal direction of the trench portions.

At the upper surface of the semiconductor substrate, the emitter region of the boundary portion may be arranged at a position facing the emitter region of the transistor portion. At the upper surface of the semiconductor substrate, the emitter region of the boundary portion may be arranged at a position facing the region of the second conductivity type of the transistor portion.

The emitter region arranged at a most end in the longitudinal direction of the trench portions of a plurality of the emitter regions in the mesa portion of the boundary portion may be arranged closer to a center of the mesa portion in the longitudinal direction than the emitter region arranged at a most end in the longitudinal direction of the trench portions of the emitter regions in the mesa portion of the transistor portion.

The semiconductor device may include a suppression portion formed on the semiconductor substrate, arranged between the diode portion and the boundary portion at the upper surface of the semiconductor substrate, and having the collector region. The suppression portion may have the mesa portion. The mesa portion of the suppression portion may have, at the upper surface, a second conductivity type region having a doping concentration lower than a doping concentration of the second conductivity type region of the transistor portion.

At the upper surface of the mesa portion of the transistor portions, the one emitter region in contact with the gate trench portion may be provided continuously along the longitudinal direction of the trench portions. At the upper surface of the mesa portion of the boundary portions, a plurality of the emitter regions in contact with the gate trench portion may be provided discretely along the longitudinal direction of the trench portions.

The semiconductor device may include a first extraction portion formed on the semiconductor substrate, arranged between the transistor portion and the boundary portion at the upper surface of the semiconductor substrate, and having the collector region. The first extraction portion may have the mesa portion. The mesa portion of the first extraction portion may have a contact region of the second conductivity type at the upper surface and may not have a region of the first conductivity type at the upper surface. The semiconductor device may include an second extraction portion formed on the semiconductor substrate, arranged between the diode portion and the boundary portion at the upper surface of the semiconductor substrate, and having the collector region. The second extraction portion may have the mesa portion. The mesa portion of the second extraction portion may have a contact region of the second conductivity type at the upper surface and not have a region of the first conductivity type at the upper surface.

The boundary portion may have two or more of the mesa portions. As a mesa portion in each of the mesa portions of the boundary portion is closer to the diode portion, the density of the region in which the channel portion in a mesa portion is projected onto the upper surface of the mesa portion of the boundary portion may become smaller. The density of the region in which the channel portion in the boundary portion is projected onto the upper surface of the mesa portion of the boundary portion may be 10% or more and 90% or less of the density of the region in which the channel portion in the transistor portion is projected onto the upper surface of the mesa portion of the transistor portion.

The diode portion may include the trench portion including one or more of the gate trench portions and the mesa portion. The mesa portion of the diode portion may have an emitter region having a doping concentration higher than a doping concentration of the drift region.

The boundary portion may be arranged so as to surround the transistor portion at the upper surface of the semiconductor substrate. The boundary portion may be arranged so as to surround the diode portion at the upper surface of the semiconductor substrate.

The summary of the invention does not enumerate all of the necessary features of the present invention. A subcombination of these feature groups can also be an invention.

DESCRIPTION OF EXEMPLARY EMBODIMENTS

Hereinafter, the present invention will be described through the embodiments of the invention, but the following embodiments do not limit the invention according to the claims. Further, not all combinations of features described in the embodiments are essential to the solution of the invention.

In the present specification, one side in a direction parallel to the depth direction of the semiconductor substrate is referred to as "upper", and the other side is referred to as "lower". Of the two main surfaces of the substrate, the layer or other members, one surface is referred to as the upper surface, and the other surface is referred to as the lower surface. The directions of "upper" and "lower" are not limited to the direction of gravity or the direction of attachment to a substrate or the like when mounting a semiconductor device.

In this specification, technical matters may be described using the orthogonal coordinate axes of the X-axis, the Y-axis, and the Z-axis. In this specification, a plane parallel to the upper surface of the semiconductor substrate is taken as the XY plane, and a depth direction perpendicular to the upper surface of the semiconductor substrate is taken as the Z-axis.

In each embodiment, an example in which the first conductivity type is the N-type and the second conductivity type is the P-type is shown, but the first conductivity type may be the P-type and the second conductivity type may be the N-type. In this case, the conductivity types of the substrate, the layer, the region and the like in the respective embodiments have opposite polarities. Moreover, when the conductivity type is described as the $P_+$-type (or the $N_+$-type) in the present specification, it means that the doping concentration of the $P_+$-type (or the $N_+$-type) is higher than the P-type (or the N-type), and when the conductivity type is described as the $P_-$-type (or the $N_-$-type), it means that the doping concentration of the $P_-$-type (or the $N_-$-type) is lower than the P-type (or the N-type).

As used herein, the doping concentration refers to the concentration of donors or acceptor impurities. In the present specification, the concentration difference of the donors and the acceptors may be referred to as the doping concentration. Further, the peak value of the doping concentration distribution in the doping region may be taken as the doping concentration in the doping region.

Figure 1A:
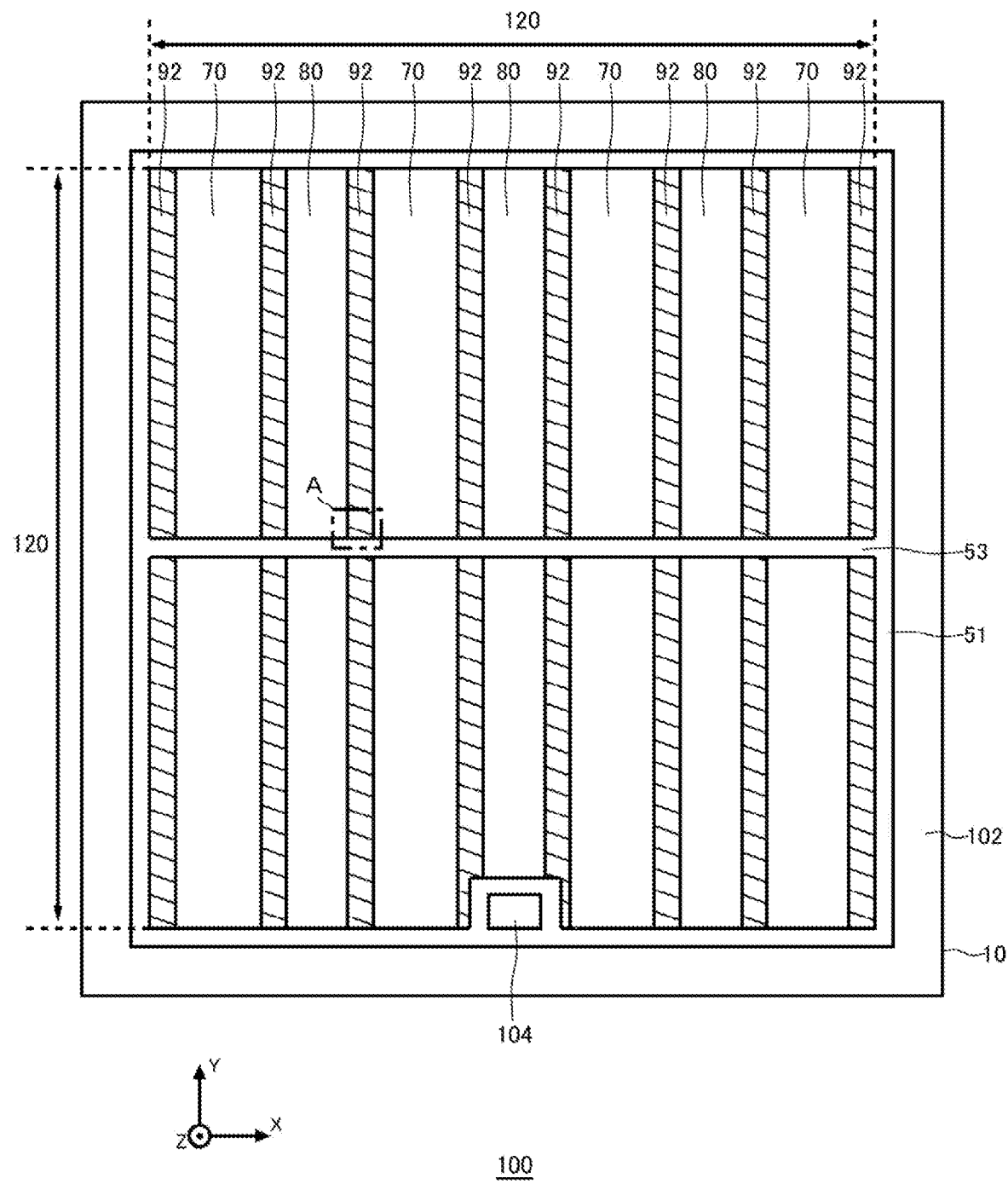
FIG. 1A is a diagram showing the upper surface of a semiconductor device 100 according to an embodiment of the present invention.

FIG. 1A is a diagram showing the upper surface of a semiconductor device 100 according to an embodiment of the present invention. The semiconductor device 100 includes a semiconductor substrate 10. The semiconductor substrate 10 may be a silicon substrate, a silicon carbide substrate, a nitride semiconductor substrate or the like such as gallium nitride, or an oxide semiconductor substrate or the like such as zinc oxide. The semiconductor substrate 10 of the example is a silicon substrate.

The semiconductor device 100 includes an active portion 120. An active portion 120 is a region through which a main current flows between the upper surface and the lower surface of a semiconductor substrate 10 when the semiconductor device 100 is controlled to be in the on state. That is, the active portion 120 is a region through which the current flows from the upper surface to the lower surface of the semiconductor substrate 10 or from the lower surface to the upper surface in the depth direction through the inside of the semiconductor substrate 10.

The active portion 120 includes a transistor portion 70, a diode portion 80 and a boundary portion 92. A region including any of the transistor portion 70, the diode portion 80, and the boundary portion 92 may referred to as the active portion 120. Further, a region sandwiched by any two of the transistor portion 70, the diode portion 80, and the boundary portion 92 in top view is also referred to as an active portion 120. In the present specification, the top view refers to viewing from a direction perpendicular to the upper surface of the semiconductor substrate 10. In top view, configurations arranged at different depths may be displayed in the same plane.

The transistor portion 70 and the diode portion 80 may be alternately arranged along a predetermined direction (the X-axis direction in the example of FIG. 1A) at the upper surface of the semiconductor substrate 10. The boundary portion 92 is arranged at the boundary between the transistor portion 70 and the diode portion 80. The boundary portion 92 of the example is arranged at each boundary in the X-axis direction of the transistor portion 70 and the diode portion 80.

The transistor portion 70 and the boundary portion 92 are provided with respective channel portions through which the above-described main current flow. However, the density of the channel portion of the boundary portion 92 is smaller than the density of the channel portion of the transistor portion 70. The density of the channel portion is the ratio of the area of the channel portion to the unit area in top view. The structure of the channel portion will be described later.

By providing the boundary portion 92, the channel density at the boundary between the transistor portion 70 and the diode portion 80 can be stepwise decreased from the channel density of the transistor portion 70. In the example, the diode portion 80 does not include a channel portion. As a result, the saturation current density at the boundary between the transistor portion 70 and the diode portion 80 can be reduced, and current crowding at the boundary when a short circuit occurs can be relaxed.

The semiconductor device 100 of the example includes a gate runner portion 51. The gate runner portion 51 is a region provided with at least one of a gate metal layer and a gate runner described later. The gate runner portion 51 may be provided to surround the active portion 120 in top view. In addition, the gate runner portion 51 may have an active inner wiring portion 53 arranged so as to overlap the active portion 120 in top view. The active inner wiring portion 53 may be arranged to cross the active portion 120 in top view. The active inner wiring portion 53 of the example traverses the active portion 120 along the X-axis direction (that is, the direction in which the transistor portion 70 and the diode portion 80 are arranged). The active portion 120 of the example is divided by the active inner wiring portion 53 in the Y-axis direction.

The semiconductor device 100 of the example further includes a gate pad 104. The gate pad 104 is an electrode to which a gate voltage is applied. The gate pad 104 is connected to the gate runner portion 51. The gate runner portion 51 transmits the gate voltage applied to the gate pad 104 to the transistor portion 70 and the boundary portion 92. The semiconductor device 100 may further have a pad other than the gate pad 104. Each pad may be arranged outside the active portion 120.

The semiconductor device 100 of the example further includes an edge termination structure portion 102. The edge termination structure portion 102 is arranged to surround the active portion 120 in top view. The edge termination structure portion 102 of the example is arranged between the gate runner portion 51 and the outer peripheral end of the semiconductor substrate 10 in top view. The edge termination structure portion 102 relieves the concentration of the electric field at the upper surface side of the semiconductor substrate 10. The edge termination structure portion 102 has a structure of, for example, a guard ring, a field plate, a RESURF (REduced SURace electric Field), and a combination thereof.

Figure 1B:
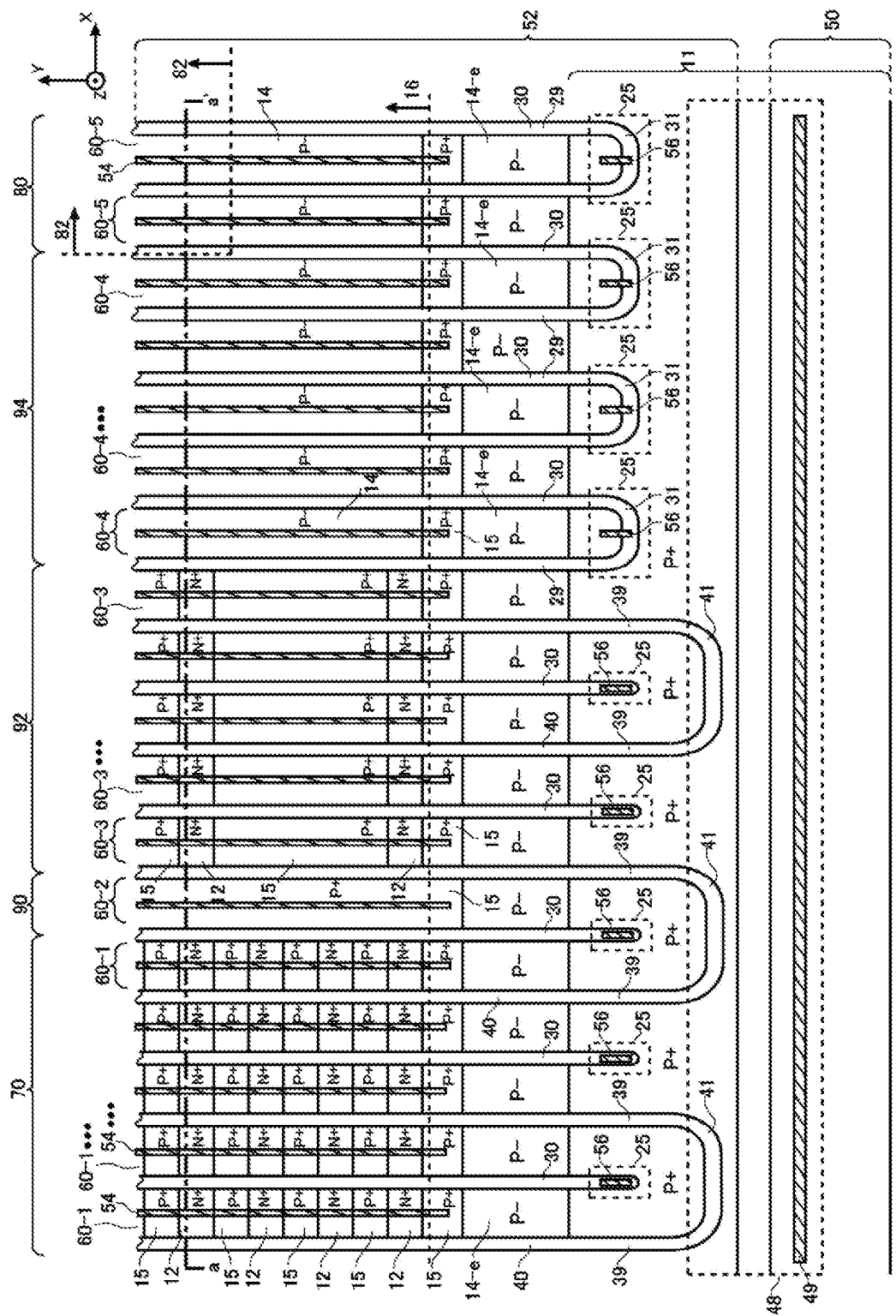
FIG. 1B is an enlarged view of a region A of FIG. 1A.

FIG. 1B is an enlarged view of a region A of FIG. 1A. As shown in FIG. 1A, the semiconductor device 100 is a semiconductor chip including the transistor portion 70, the diode portion 80, and the boundary portion 92. The semiconductor device 100 may further include at least one of a extraction portion 90 and a suppression portion 94.

The transistor portion 70 includes a transistor such as an IGBT. The diode portion 80 includes a diode such as an FWD. The boundary portion 92 is arranged between transistor portion 70 and the diode portion 80 at the upper surface of the semiconductor substrate.

The region A in the vicinity of the active inner wiring portion 53 crossing the active region is shown in FIG. 1B. The active inner wiring portion 53 of the example includes both a gate metal layer 50 and a gate runner 48, but the active inner wiring portion 53 may include only one of a gate metal layer 50 and the gate runner 48. As an example, the gate metal layer 50 is a wire formed of a metal material, and the gate runner 48 is a wire formed of polysilicon doped with impurities. The semiconductor device 100 may have the same structure as that shown in FIG. 1B in the vicinity of the gate runner portion 51 surrounding the active portion 120.

The extraction portion 90 is provided between the transistor portion 70 and the diode portion 80 at the upper surface of the semiconductor substrate. Although the extraction portion 90 of the example of FIG. 1B is provided between the transistor portion 70 and the boundary portion 92, the extraction portion 90 may be provided between the boundary portion 92 and the diode portion 80. The suppression portion 94 is provided between the boundary portion 92 and the diode portion 80 at the upper surface of the semiconductor substrate.

The semiconductor device 100 of the example includes the gate trench portion 40, a dummy trench portion 30, a $P_+$-type well region 11, an $N_+$-type emitter region 12, a $P_-$-type base region 14 and a P+-type contact region 15 which are provided inside a semiconductor substrate and exposed on the upper surface of the semiconductor substrate. In the present specification, the gate trench portion 40 or the dummy trench portion 30 may be simply referred to as a trench portion. In addition, the semiconductor device 100 of the example includes an emitter electrode 52 and the gate metal layer 50 provided above the upper surface of the semiconductor substrate. Emitter electrode 52 and gate metal layer 50 are provided separately from each other.

An interlayer dielectric film is formed between the emitter electrode 52 and the gate metal layer 50, and the upper surface of the semiconductor substrate, which is omitted in FIG. 1B. A contact hole 56, a contact hole 49 and a contact hole 54 are formed through the interlayer dielectric film in the interlayer dielectric film of the example.

The emitter electrode 52 is in contact with emitter region 12, the contact region 15 and the base region 14 at the upper surface of the semiconductor substrate through the contact hole 54. Further, emitter electrode 52 is connected to a dummy conductive portion in dummy trench portion 30 through the contact hole 56. Between the emitter electrode 52 and the dummy conductive portion, a connection portion 25 formed of a conductive material such as polysilicon doped with impurities may be provided. A dielectric film such as an oxide film is formed between the connection portion 25 and the upper surface of the semiconductor substrate.

The gate metal layer 50 contacts the gate runner 48 through the contact hole 49. Gate runner 48 is connected to a gate conductive portion in gate trench portion 40 at the upper surface of the semiconductor substrate. The gate runner 48 is not connected to the dummy conductive portion in dummy trench portion 30. The gate runner 48 of the example is formed from the lower side of the contact hole 49 to a edge portion 41 of the gate trench portion 40. A dielectric film such as an oxide film is formed between the gate runner 48 and the upper surface of the semiconductor substrate. The gate conductive portion is exposed at the upper surface of the semiconductor substrate at the edge portion of the gate trench portion 40. A contact hole connecting the gate conductive portion and the gate runner 48 is provided in the dielectric film above the gate conductive portion. In FIG. 1B, there is a portion where the emitter electrode 52 and the gate runner 48 overlap in plan view, but the emitter electrode 52 and the gate runner 48 are electrically insulated from each other with a dielectric film (not shown) interposed therebetween.

Emitter electrode 52 and gate metal layer 50 are formed of a material containing a metal. For example, at least a partial region of each electrode is formed of aluminum or aluminum-silicon alloy. Each electrode may have a barrier metal formed of titanium, a titanium compound, or the like under the region formed of aluminum or the like, and may have a plug formed of tungsten or the like in the contact hole.

The one or more gate trench portions 40 and the one or more dummy trench portions 30 are arranged at a predetermined interval along a predetermined arrangement direction (in the example, the X-axis direction) at the upper surface of the semiconductor substrate. In the transistor portion 70, the extraction portion 90, and the boundary portion 92 of the example, one or more gate trench portions 40 and one or more dummy trench portions 30 are alternately formed in the arrangement direction.

The gate trench portion 40 of the example has two linear portions 39 linearly extending along a longitudinal direction (in the example, the Y-axis direction) perpendicular to the arrangement direction, and the edge portion 41 connecting the two linear portions 39. Preferably, at least part of the edge portion 41 is formed in a curved shape at the upper surface of the semiconductor substrate. The crowding of the electric field at the end portion of the linear portion 39 can be relaxed by the edge portion 41 connecting the end portions that are the ends of the linear shape along the longitudinal direction in the two linear portions 39 of the gate trench portion 40. In the present specification, the respective linear portions 39 of the gate trench portion 40 are treated as one gate trench portion 40.

At least one dummy trench portion 30 is provided between the respective linear portions 39 of the gate trench portions 40. The dummy trench portions 30 may have a linear shaped extending in the longitudinal direction. In the example shown in FIG. 1B, the linear portions 39 of the gate trench portions 40 and the straight dummy trench portions 30 are alternately arranged along the X-axis direction at the upper surface of the semiconductor substrate in the transistor portion 70, the extraction portion 90 and the boundary portion 92.

In the suppression portion 94 and diode portion 80, a plurality of dummy trench portions 30 is arranged along the X-axis direction at the upper surface of the semiconductor substrate. The shape of the dummy trench portion 30 in the XY plane in the suppression portion 94 and the diode portion 80 may be linear shape as in the dummy trench portion 30 provided in the transistor portion 70, and may have a linear portion 29 and a edge portion 31 as in the gate trench portion 40.

The edge portion 31 and the linear portion 29 of the dummy trench portion 30 have the same shape as the edge portion 41 and the linear portions 39 of the gate trench portion 40. The dummy trench portion 30 provided in the diode portion 80 and the linear shaped dummy trench portion 30 provided in the transistor portion 70 may have the same length in the Y-axis direction.

The emitter electrode 52 is formed above the gate trench portion 40, the dummy trench portion 30, the well region 11, the emitter region 12, the base region 14 and the contact region 15. The well region 11 and the end of the contact hole 54 in the longitudinal direction are provided apart in the XY plane. The diffusion depth of well region 11 may be deeper than the lower ends of the gate trench portion 40 and the dummy trench portion 30. The ends of the gate trench portion 40 and the dummy trench portion 30 in the extending direction are formed in the well region 11. The bottom of the edge portion 41 of the gate trench portion 40 in the Z-axis direction, the bottom at the end of the linear shaped dummy trench portion 30 in the longitudinal direction, and the bottom of the edge portion 31 of the dummy trench portion 30 may be covered with the well region 11.

Each of the transistor portion 70, the extraction portion 90, the boundary portion 92, the suppression portion 94, and the diode portion 80 is provided with one or more mesa portions 60 sandwiched by the respective trench portions. A mesa portion 60 is a region on the upper surface side of the region of the semiconductor substrate sandwiched by the trench portion relative to the deepest bottom of the trench portion.

The base region 14 is formed in the mesa portion 60 sandwiched between the respective trench portions. The base region 14 is the second conductivity type ($P_-$-type) having a doping concentration lower than that of well region 11. The well region 11 is the second conductivity type ($P_+$-type).

The contact region 15 of the second conductivity type, which has a higher doping concentration than the base region 14, is formed at the upper surface of the base region 14 of the mesa portion 60. The contact region 15 of the example is the $P_+$-type. At the upper surface of the semiconductor substrate, the well region 11 may be formed away in the direction of the gate metal layer 50 from the contact region 15 arranged at the most end of the contact region 15 in the active region in the Y-axis direction. The base region 14 is exposed between the well region 11 and the contact region 15 at the upper surface of the semiconductor substrate.

In transistor portion 70 and boundary portion 92, the emitter region 12 of the first conductivity type having a doping concentration higher than that of the drift region formed inside the semiconductor substrate is selectively formed on the upper surface of mesa portion 60. The emitter region 12 of the example is the $N_+$-type. Of the base region 14 in contact with the emitter region 12 in the semiconductor substrate depth direction (the −Z-axis direction), a portion in contact with the gate trench portion 40 functions as a channel portion. When an on voltage is applied to the gate trench portion 40, a channel, which is an inversion layer of electrons, is formed in a portion in contact with the gate trench portion 40 in the base region 14 provided between the emitter region 12 and the drift region in the Z-axis direction. The region where the channel is formed in the base region 14 is referred to as a channel portion 17 (see FIGS. 3 and 4). In this specification, the area of a region in which the region in which the channel is formed is projected perpendicularly onto the upper surface of the semiconductor substrate may be described as the area of the channel portion 17. By forming the channel in the base region 14, carriers flow between the emitter region 12 and the drift region.

The density of the channel portion at the upper surface of the mesa portion 60-3 of the boundary portion 92 at the upper surface of the mesa portion 60-3 is smaller than the density of the channel portion at the upper surface of the mesa portion 60-1 of the transistor portion 70. On the other hand, gate trench portion 40 is not provided in diode portion 80 and suppression portion 94, and a channel portion does not exist. In the example, no emitter region 12 is provided in the respective mesa portions 60 of the diode portion 80 and the suppression portion 94.

By providing the boundary portion 92, the channel density at the boundary between the transistor portion 70 and the diode portion 80 can be gradually decreased from the channel density of the transistor portion 70. As a result, the saturation current density at the boundary between the transistor portion 70 and the diode portion 80 can be reduced, and current crowding at the boundary when a short circuit occurs can be relaxed. The saturation current density is a saturation current density of the current flowing from a collector electrode 24 to the emitter electrode 52 when the potential of the collector electrode 24 is made higher than the potential of the emitter electrode 52 in a state where a gate voltage equal to or higher than the gate threshold voltage is applied to the gate metal layer in the transistor portion 70. The saturation current density is a current density of a current flowing between the collector electrode 24 and the emitter electrode 52 which is saturated to a predetermined current density determined by the difference between the gate voltage and the gate threshold voltage to become a substantially constant value.

In the example, base regions 14-e are arranged at both ends of each mesa portion 60 in the Y-axis direction (in FIG. 1B, only one end in the Y-axis direction is shown). In the example, at the upper surface of each mesa portion 60, the region in contact with the base region 14-e at the center side of the mesa portion 60 is the contact region 15. Further, the region in contact with the base region 14-e on opposite the contact region 15 is the well region 11.

The contact regions 15 and the emitter regions 12 are alternately arranged along the Y-axis direction in the region sandwiched by the base regions 14-e at both ends in the Y-axis direction in the mesa portion 60-1 of the transistor portion 70 of the example. Each of the contact region 15 and the emitter region 12 is formed from one of the adjacent trench portions to the other trench portion.

The contact region 15 is provided in the entire region sandwiched by the base regions 14-e at both ends in the Y-axis direction in each mesa portion 60-2 of the extraction portion 90 of the example. The contact regions 15 and the emitter regions 12 are alternately arranged along the Y-axis direction in the regions sandwiched by the base regions 14-e at both ends in the Y-axis direction in each mesa portion 60-3 of the boundary portion 92 of the example. In the example, the sum of the area of the emitter region 12 provided for one mesa portion 60-3 is smaller than the sum of the area of the emitter region 12 provided for one mesa portion 60-1. In addition, the sum of the area of the emitter region 12 per unit area in the boundary portion 92 may be smaller than the sum of the area of the emitter region 12 per unit area in the transistor portion 70. Thereby, the channel density of the boundary portion 92 can be made smaller than the channel density of the transistor portion 70.

In each mesa portion 60-4 of the suppression portion 94 and each mesa portion 60-5 of the diode portion 80 of the example, the contact region 15 in contact with the base regions 14-e at both ends in the Y-axis direction at the center side of the mesa portion 60 is provided. The base region 14 is exposed in a center side region of the mesa portion 60 relative to the contact region 15. The center side of the mesa portion 60 refers to the side closer to the center of the mesa portion 60 in the Y-axis direction.

The contact hole 54 is formed above each of the contact region 15 and the emitter region 12 in each mesa portion 60-1 of the transistor portion 70 of the example. The contact hole 54 is formed above the contact region 15 in each mesa portion 60-2 of the extraction portion 90 of the example. The contact hole 54 is formed above each of the contact region 15 and the emitter region 12 in each mesa portion 60-3 of the boundary portion 92 of the example. The contact hole 54 is formed above each of the base region 14 and the contact region 15 in each mesa portion 60 of the suppression portion 94 and the diode portion 80 of the example. The contact hole 54 is not formed in the regions corresponding to the base region 14-e and the well region 11 in each mesa portion 60 of the example. The contact hole 54 in each mesa portion 60 of the transistor portion 70, the extraction portion 90, the boundary portion 92, the suppression portion 94, and the diode portion 80 may have the same length in the Y-axis direction.

In the diode portion 80, the $N_+$-type cathode region 82 is formed in a region in contact with a lower surface 23 (see FIG. 2A) of the semiconductor substrate. In FIG. 1B, a region where the cathode region 82 is formed is indicated by a dotted line. The $P_+$-type collector region may be formed in a region where the cathode region 82 is not formed in a region in contact with the lower surface 23 of the semiconductor substrate. In the collector region, the collector region of the suppression portion 94 may extend. The diode portion 80 may be a region overlapping the cathode region 82 in the Z-axis direction. The region where the cathode region 82 is projected onto the upper surface of the semiconductor substrate may be away from the contact region 15 in the +Y-axis direction. Of the mesa portion 60-5 of the diode portion 80, when the cathode region 82 is formed in part of the lower surface 23, the portion of the mesa portion 60-5 in contact with the cathode region 82 and in which the collector region is formed in the lower surface 23 may also be the diode portion 80.

Of the region overlapping the collector region in the Z-axis direction, the transistor portion 70 and the boundary portion 92 may be a region where the mesa portion 60 in which the contact region 15 and the emitter region 12 are formed, and the trench portion in contact with the mesa portion 60 are provided. However, the boundary portion 92 is a region whose channel density is lower than that of the transistor portion 70.

Of the region overlapping the collector region in the Z-axis direction, the extraction portion 90 and the suppression portion 94 may be a region where a mesa portion 60 in which the P-type region (in the example, the base region 14 or the contact region 15) is formed and the N-type region (in the example, the emitter region 12) is not formed, and the trench portion in contact with the mesa portion 60 are provided. However, the doping concentration of the P-type region (the base region 14 in the example) formed in the region sandwiched by the base regions 14-e in the mesa portion 60-4 of the suppression portion 94 is lower than the doping concentration of the P-type region (the contact region 15 in the example) formed in the region sandwiched by the base regions 14-e in the mesa portion 60-2 of the extraction portion 90.

The semiconductor device 100 may have an $N_+$-type accumulation region 16 arranged under the base region 14 in the Z-axis direction in each mesa portion 60. In FIG. 1B, the range in which the accumulation region 16 is provided in the XY plane is indicated by a broken line. The accumulation region 16 of the example is formed in a region sandwiched by the base regions 14-e in each mesa portion 60. The end (the broken line in FIG. 1B) of accumulation region 16 in the Y-axis direction may be arranged to overlap with the contact region 15 in contact with the base region 14-e. The accumulation region 16 may be arranged to overlap at least all the channel portions in the XY plane.

Figure 2A:
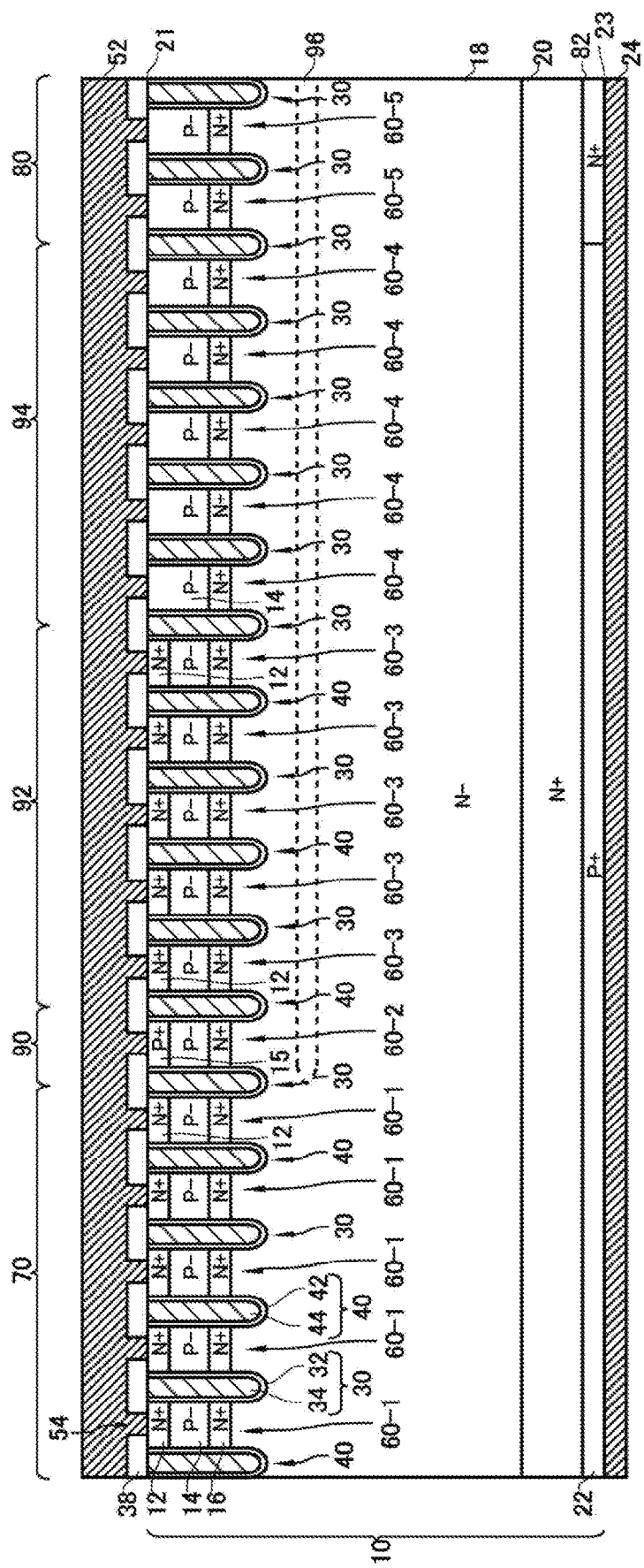
FIG. 2A is a diagram showing an example of the a-a' cross section shown in FIG. 1B.

FIG. 2A is a diagram showing an example of the a-a' cross section shown in FIG. 1B. The a-a' cross section is a cross section parallel to the XZ plane and passing through the emitter region 12 of the transistor portion 70. The semiconductor device 100 of the example has the semiconductor substrate 10, an interlayer dielectric film 38, the emitter electrode 52, and the collector electrode 24 in the cross section.

The semiconductor substrate 10 may be a silicon substrate, a silicon carbide substrate, or a nitride semiconductor substrate or the like such as gallium nitride. The semiconductor substrate 10 of the example is a silicon substrate.

The interlayer dielectric film 38 is formed to cover at least part of the upper surface of semiconductor substrate 10. A through hole such as the contact hole 54 is formed in the interlayer dielectric film 38. The contact hole 54 exposes the upper surface of the semiconductor substrate 10. The interlayer dielectric film 38 may be silicate glass such as PSG or BPSG, or may be an oxide film or a nitride film.

The emitter electrode 52 is formed on the upper surfaces of the semiconductor substrate 10 and the interlayer dielectric film 38. The emitter electrode 52 is also formed inside the contact hole 54, and is in contact with the upper surface of the semiconductor substrate 10 exposed by the contact hole 54.

The collector electrode 24 is formed on the lower surface of the semiconductor substrate 10. The collector electrode 24 may be in contact with the entire lower surface of the semiconductor substrate 10. Emitter electrode 52 and collector electrode 24 are formed of a conductive material such as metal. In the present specification, the direction connecting the emitter electrode 52 and the collector electrode 24 is referred to as the depth direction (the Z-axis direction). The direction from the collector electrode 24 to the emitter electrode 52 is taken as the positive direction of the Z-axis direction. In the present specification, the surface on the positive side in the Z-axis direction of each member may be referred to as the upper surface, and the surface on the negative side may be referred to as the lower surface.

The $P_-$-type base region 14 is formed at the upper surface of the semiconductor substrate 10 in the cross section. The $N_-$-type drift region 18 is arranged below the base region 14 inside the semiconductor substrate 10. Each trench portion is provided from the upper surface of the semiconductor substrate 10 through the base region 14 to reach the drift region 18.

In the cross section, in each mesa portion 60 of the transistor portion 70 and the boundary portion 92, the $N_+$-type emitter region 12, the $P_-$-type base region 14 and the $N_+$-type accumulation region 16 are formed in order from the upper surface side of the semiconductor substrate 10. The accumulation region 16 accumulates donors at a higher concentration than the drift region 18. Below the accumulation region 16, the drift region 18 is provided. The accumulation region 16 may be provided to cover the entire lower surface of the base region 14 in each mesa portion 60. That is, the accumulation region 16 may be sandwiched in the trench portion in the Y-axis direction or the X-axis direction. By providing the accumulation region 16 having a concentration higher than that of the drift region 18, between the drift region 18 and the base region 14, the on voltage in the transistor portion 70 can be reduced by enhancing the carrier injection-enhancement effect (IE effect, Injection-Enhancement effect).

In the XZ cross section passing through the contact region 15 of the transistor portion 70, the contact region 15 is provided in each mesa portion 60 of the transistor portion 70 instead of the emitter region 12. The structure of the mesa portion 60 of the transistor portion 70 other than the contact region 15 is the same as the structure in the cross section. The emitter region 12 of the boundary portion 92 and the emitter region 12 of the transistor portion 70 may be arranged in the same XZ cross section, or may be arranged in different XZ cross sections. The contact region 15 may function as a latch-up suppression layer that suppresses latch-up.

In each mesa portion 60 of the diode portion 80 and the suppression portion 94 in the cross section, the $P_-$-type base region 14 and the $N_+$-type accumulation region 16 are arranged in order from the upper surface side of the semiconductor substrate 10. Below the accumulation region 16, the drift region 18 is provided. The accumulation region 16 may not be provided in the diode portion 80 and the suppression portion 94.

In each mesa portion 60 of the extraction portion 90 in the cross section, the $P_+$-type contact region 15, the $P_-$-type base region 14 and the $N_+$-type accumulation region 16 are arranged in order from the upper surface side of the semiconductor substrate 10. Below the accumulation region 16, the drift region 18 is provided.

The $P_+$-type collector region 22 is provided in a region in contact with the lower surface of the semiconductor substrate 10 in the transistor portion 70, the extraction portion 90, the boundary portion 92, and the suppression portion 94. The $N_+$-type cathode region 82 is provided in a region in contact with the lower surface of the semiconductor substrate 10 in the diode portion 80.

As shown in FIG. 1B, the channel density of the boundary portion 92 is smaller than the channel density of the transistor portion 70. Therefore, it is possible to gently reduce the change in channel density toward the diode portion 80 between the transistor portion 70 and the diode portion 80. Therefore, particularly at the time of occurrence of a short circuit, a change in the carrier density between the transistor portion 70 and the diode portion 80 can be moderated, and the concentration of the electric field and the current can be relaxed. For this reason, the short circuit withstand capability of the semiconductor device 100 can be improved.

In the semiconductor substrate 10 of the example, an $N_+$-type buffer region 20 is provided between the drift region 18 and the collector region 22 and between the drift region 18 and the cathode region 82. The doping concentration of the buffer region 20 is higher than the doping concentration of drift region 18. The buffer region 20 may function as a field stop layer that prevents the depletion layer extending from the lower surface side of base region 14 from reaching the $P_+$-type collector region 22 and the $N_+$-type cathode region 82.

As described above, one or more gate trench portions 40 and one or more dummy trench portions 30 are formed at the upper surface of the semiconductor substrate 10. Each trench portion penetrates the base region 14 from the upper surface of semiconductor substrate 10 to reach the drift region 18. In the region where at least one of the emitter region 12, the contact region 15 and the accumulation region 16 is provided, each trench portion also penetrates these regions to reach the drift region 18. The fact that the trench portion penetrates the doping region is not limited to the case in which the trench portion is manufactured after the doping region is formed. The fact that the trench portion penetrates the doping region includes the case in which after forming the trench portion, the doping region is formed between the trench portions.

The gate trench portion 40 is a gate trench formed at the upper surface of the semiconductor substrate 10, and has a gate dielectric film 42, and a gate conductive portion 44. The gate dielectric film 42 is formed to cover the inner wall of the gate trench. The gate dielectric film 42 may be formed by oxidizing or nitriding the semiconductor of the inner wall of the gate trench. The gate conductive portion 44 is formed on inner side than the gate dielectric film 42 inside the gate trench. That is, the gate dielectric film 42 insulates the gate conductive portion 44 and the semiconductor substrate 10. The gate conductive portion 44 is formed of a conductive material such as polysilicon.

The gate conductive portion 44 includes facing regions with at least the base region 14 and the gate dielectric film 42 interposed therebetween. The gate trench portion 40 in the cross section is covered with the interlayer dielectric film 38 at the upper surface of the semiconductor substrate 10. When a predetermined voltage is applied to the gate conductive portion 44, a channel of the inversion layer of electrons is formed in the surface layer of the interface in the base region 14 in contact with the gate trench.

The dummy trench portion 30 may have the same structure as the gate trench portion 40 in the cross section. The dummy trench portion 30 is a dummy trench formed at the upper surface of the semiconductor substrate 10, and has a dummy dielectric film 32 and a dummy conductive portion 34. The dummy dielectric film 32 is formed to cover the inner wall of the dummy trench. The dummy conductive portion 34 is formed inside the dummy trench and is formed on inner side than the dummy dielectric film 32. The dummy dielectric film 32 insulates the dummy conductive portion 34 and the semiconductor substrate 10. The dummy conductive portion 34 may be formed of the same material as the gate conductive portion 44. For example, the dummy conductive portion 34 is formed of a conductive material such as polysilicon. The dummy conductive portion 34 may have the same length as the gate conductive portion 44 in the depth direction. The dummy trench portion 30 in the cross section is covered with the interlayer dielectric film 38 at the upper surface of the semiconductor substrate 10. The bottoms of the dummy trench portion 30 and the gate trench portion 40 may be convex downward (curved in cross section).

An upper surface side lifetime control portion 96 which is a region in which a lifetime killer is formed may be provided inside the semiconductor substrate 10. The upper surface side lifetime control portion 96 may be arranged between the bottom of the trench portion and the center of the semiconductor substrate 10 in the Z-axis direction. The lifetime killer is a carrier recombination center and may be a crystal defect, and may be vacancies, double vacancies, defect complex of these with elements constituting the semiconductor substrate 10, dislocations, rare gas elements such as helium and neon, and metal elements such as platinum.

The upper surface side lifetime control portion 96 may be provided in the diode portion 80, the suppression portion 94, the boundary portion 92, and the extraction portion 90, and may not be provided in the transistor portion 70. The upper surface side lifetime control portion 96 reduces the lifetime of carriers in the vicinity of the bottom of the trench portion such as the diode portion 80 and the like. As a result, the reverse recovery characteristics of the diode portion 80 can be improved, and the concentration of carriers in the vicinity of the boundary portion 92 can be suppressed to improve a withstand capability against destructive failure such as turn-off withstand capability, reverse recovery withstand capability, and short circuit withstand capability.

Figure 2B:
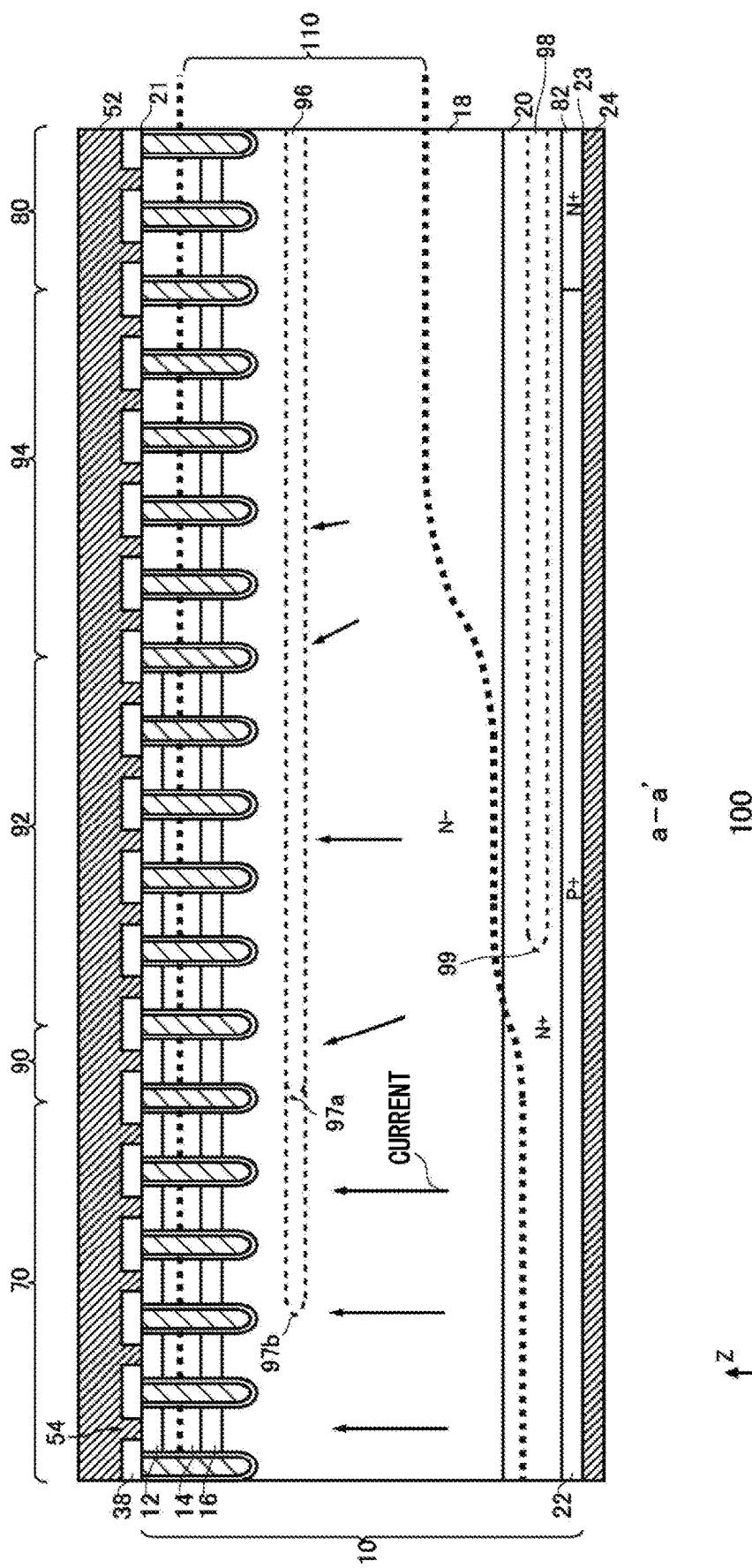
FIG. 2B is a diagram for explaining a space charge region 110 when a short circuit voltage $V_{CC}$ is applied between the collector and the emitter of the semiconductor device 100.

FIG. 2B is a diagram for explaining a space charge region 110 when the short circuit voltage $V_{CC}$ is applied between the collector and the emitter of the semiconductor device 100. For example, one arm of the inverter circuit is provided with two semiconductor devices 100 connected in series between the power-supply voltage $V_{CC}$ and the ground potential. When a short circuit occurs such that the transistor portions 70 of the two semiconductor devices 100 are both turned on for some reason, a large short circuit voltage $V_{CC}$ is applied between the collector and the emitter of one of the semiconductor devices 100.

Figure 2C:
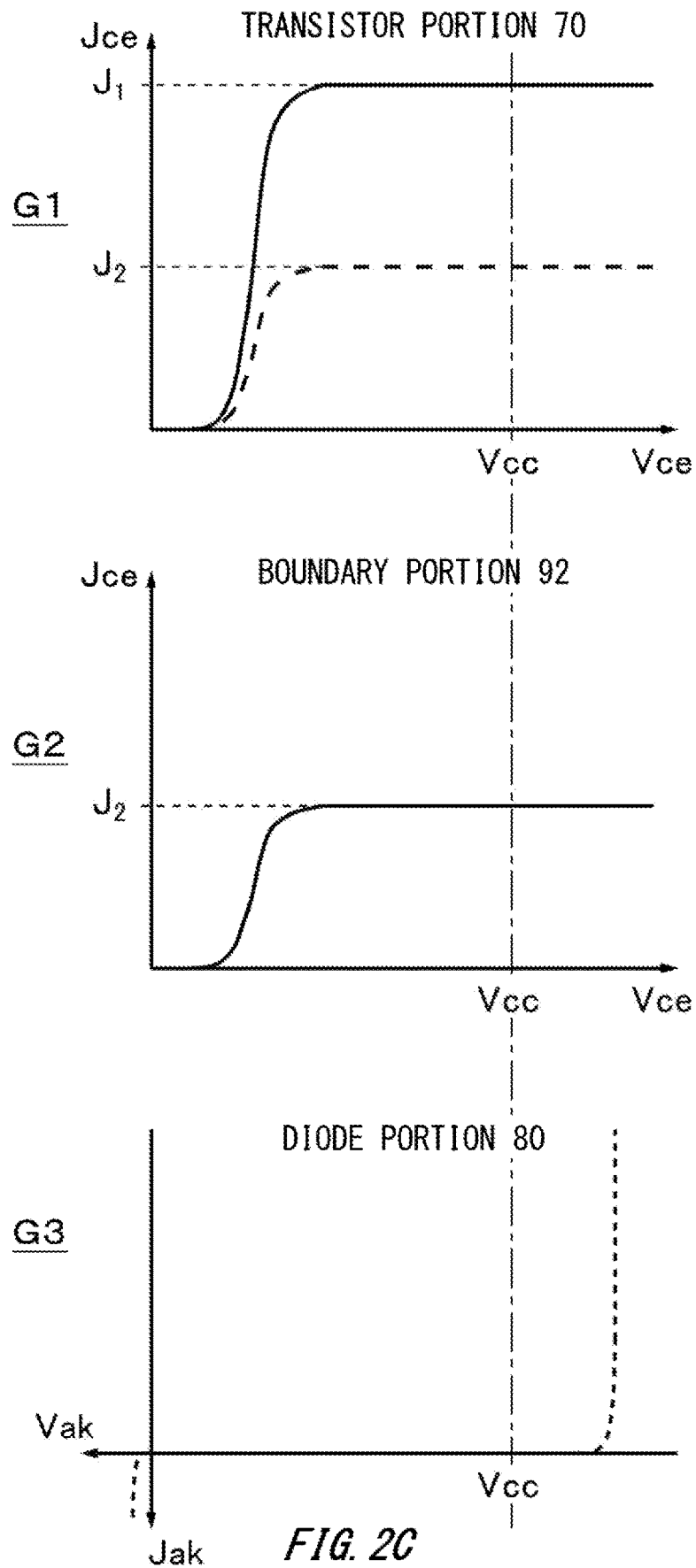
FIG. 2C is a diagram for explaining the current flowing to a transistor portion 70, a diode portion 80, and a boundary portion 92 at the time of the short circuit.

FIG. 2C is a diagram for explaining the current flowing to the transistor portion 70, the diode portion 80, and the boundary portion 92 at the time of a short circuit. A graph G1 is a graph showing characteristics of a collector-emitter voltage Vce of the transistor portion 70—a collector-emitter current density Jce. A graph G2 is a graph showing characteristics of a collector-emitter voltage Vce of the boundary portion 92—a collector-emitter current density Jce. A graph G3 is a graph showing characteristics of an anode-cathode voltage Vak of the diode portion 80—an anode-cathode current density Jak. The graph G3 displays the current and voltage directions inverted with respect to the graphs G1 and G2 based on the characteristic of the reverse conducting diode. At the time of short circuit, the current density of the current flowing to the transistor portion 70 is $J_1$, the current density of the current flowing to the boundary portion 92 is $J_2$, and the current flowing to the diode portion 80 is substantially zero.

As shown in FIG. 2B, the space charge region 110 spreads in the semiconductor device 100 when a short circuit occurs. In FIG. 2B, the end of the space charge region 110 is indicated by a broken line. As shown in graphs G1 and G2 of FIG. 2C, the current density J1 flowing through the transistor portion is higher than the current density J2 flowing through the boundary portion 92. This is because the channel density of the transistor portion is higher than the channel density of the boundary portion 92. As a result, since the transistor portion 70 has a higher electron concentration than the boundary portion 92, the space charge region 110 spreads deep in the Z-axis direction. On the other hand, since the boundary portion 92 has a lower electron concentration than the transistor portion 70, the hole concentration in the space charge region is relatively higher than that of the transistor portion 70. Therefore, the space charge region 110 spreads shallower in the Z-axis direction than that of the transistor portion 70. As shown by the graph G3 in FIG. 2C, the current hardly flows in the diode portion 80, compared to the transistor portion 70 and the boundary portion 92, and the electron concentration and the hole concentration are almost zero. That is, the drift region 18 of the diode portion 80 is substantially depleted, and the electron concentration and the hole concentration of the diode portion 80 are sufficiently smaller than the electron concentration and the hole concentration of the transistor portion 70. For this reason, the space charge region 110 in the diode portion 80 spreads most shallowly in the Z-axis direction.

The electron current at the boundary portion 92 is smaller than that at the transistor portion 70, so that the hole current is also smaller, and the total current density is smaller. Therefore, the current density flowing between the transistor portion 70 and the diode portion 80 can be suppressed.

In the example of FIG. 2A, the upper surface side lifetime control portion 96 is not provided in the transistor portion 70. That is, the position of the end 97a (see FIG. 2B) of the upper surface side lifetime control portion 96 in the X-axis direction is arranged in any of the diode portion 80, the boundary portion 92, the extraction portion 90, and the suppression portion 94. In another example, the upper surface side lifetime control portion 96 may be provided also in the transistor portion 70. That is, the position of the end 97b (see FIG. 2B) of the upper surface side lifetime control portion 96 in the X-axis direction may be extended and arranged inside the transistor portion 70. The position of the end 97b is away from the center of the transistor portion 70 by a predetermined length toward the boundary portion 92.

The semiconductor device 100 may also have a lower surface side lifetime control portion 98. The lower surface side lifetime control portion 98 is arranged below the upper surface side lifetime control portion 96. The lower surface side lifetime control portion 98 may be arranged below the center of the semiconductor substrate 10 in the Z-axis direction. As an example, the lower surface side lifetime control portion 98 is arranged in the buffer region 20.

Part of the lower surface side lifetime control portion 98 is provided in the diode portion 80. The lower surface side lifetime control portion 98 may be arranged so as to extend outward of the diode portion 80 in the X-axis direction. The end 99 of the lower surface side lifetime control portion 98 in the X-axis direction may be arranged in the transistor portion 70 or may be arranged in the boundary portion 92. The end 99 may be arranged on the extraction portion 90 or the suppression portion 94.

The end 99 of the lower surface side lifetime control portion 98 may be arranged closer to the diode portion 80 in the X-axis direction than the end 97 of the upper surface side lifetime control portion 96. That is, the length by which the lower surface side lifetime control portion 98 extends outward of the diode portion 80 may be smaller than the length by which the upper surface side lifetime control portion 96 extends outward of the diode portion 80. By providing the lower surface side lifetime control portion 98 in this manner, it is possible to suppress the injection of holes from the boundary portion 92 where the area of the contact region 15 is large to the cathode region 82. The lower surface side lifetime control portion 98 may extend to a region where the depth of the space charge region 110 at the time of a short circuit in the transistor portion 70 is substantially flat.

The peak value of the doping concentration of the base region 14 of the boundary portion 92 may be larger than the peak value of the doping concentration of the base region 14 of the transistor portion 70. When configured in this manner, the current density J2 of the boundary portion 92 is made smaller than the current density J1 of the transistor portion 70, and the saturation current density at the boundary between the transistor portion 70 and the diode portion 80 can be reduced. The peak value of the doping concentration of the base region 14 of the boundary portion 92 may be twice or more, or may be 5 times or more, or may be 10 times or more the peak value of the doping concentration of the base region 14 of the transistor portion 70.

By making the doping concentration of the base region 14 of the boundary portion 92 higher than that of the transistor portion 70, the threshold voltage of the boundary portion 92 is higher than the threshold voltage of the transistor portion 70. Therefore, the current density J2 of the boundary portion 92 is lower than the current density J1 of the transistor portion 70.

The total integral value of the doping concentration of the base region 14 of the boundary portion 92 in the depth direction may be larger than the total integral value of the doping concentration of the base region 14 of the transistor portion 70 in the depth direction. When configured in this manner, the threshold voltage of the boundary portion 92 is higher than the threshold voltage of the transistor portion 70, and the current density J2 of the boundary portion 92 is lower than the current density J1 of the transistor portion 70.

The doping concentration of the collector region 22 of the boundary portion 92 may be lower than the doping concentration of the collector region 22 of the transistor portion 70. The doping concentration may refer a peak value, or may refer a total integral value in the depth direction. When configured in this manner, the threshold voltage of the boundary portion 92 is higher than the threshold voltage of the transistor portion 70, and the current density J2 of the boundary portion 92 is lower than the current density J1 of the transistor portion 70.

The lower end of the emitter region 12 of the boundary portion 92 may be provided at a position shallower than the lower end of the emitter region 12 of the transistor portion 70 (i.e., toward an upper surface 21). When configured in this manner, the threshold voltage of the boundary portion 92 is higher than the threshold voltage of the transistor portion 70, and the current density J2 of the boundary portion 92 is lower than the current density J1 of the transistor portion 70.

At least two adjustments among the adjustment of the doping concentration of the base region 14, the adjustment of the doping concentration of the collector region 22, and the adjustment of the depth of the emitter region 12 may be combined. When these adjustments are made, the channel density of the boundary portion 92 may be identical to or lower than the channel density of the transistor portion 70.

Figure 3:
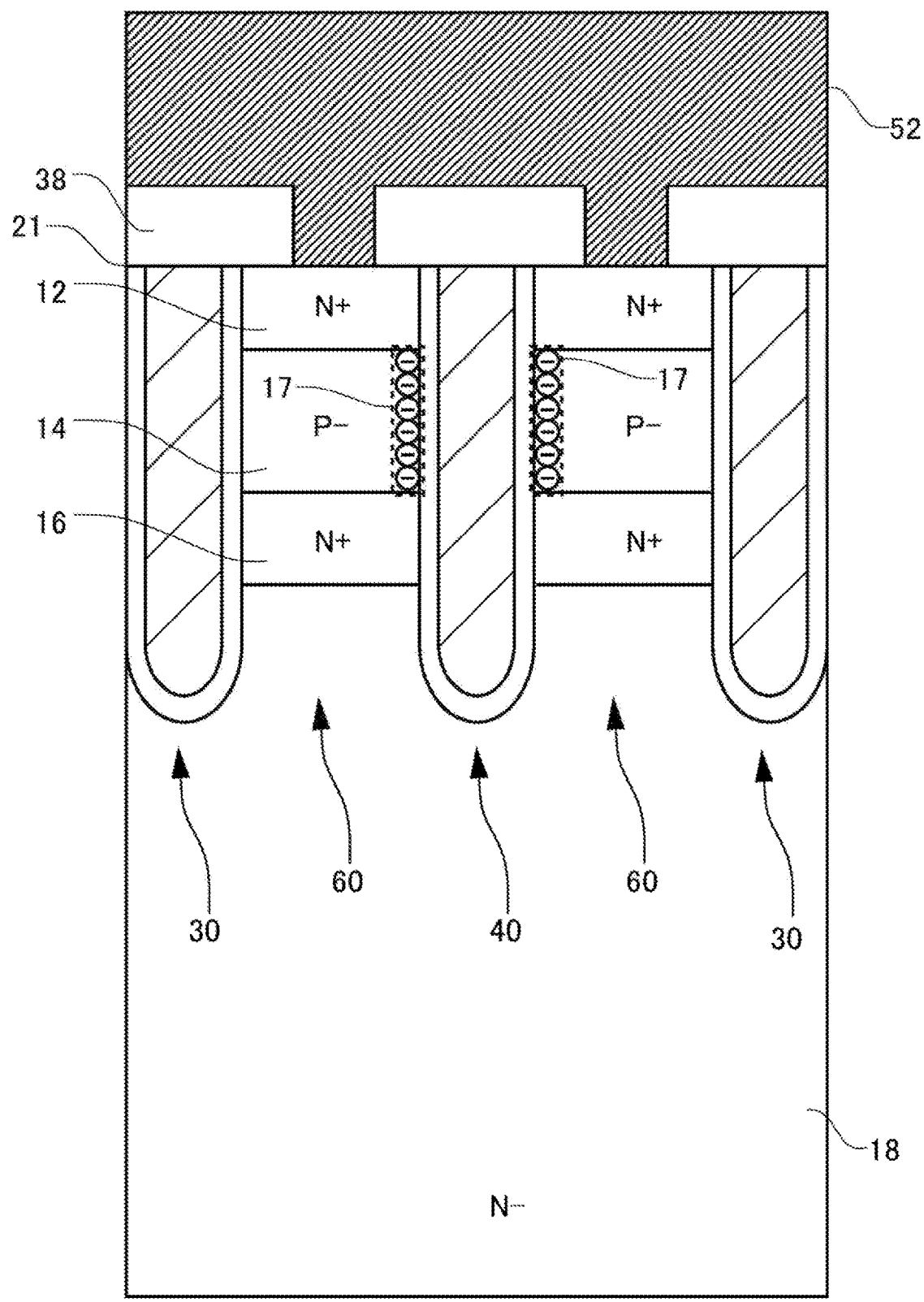
FIG. 3 is an enlarged view of the vicinity of a mesa portion 60.

FIG. 3 is an enlarged view of the vicinity of the mesa portion 60. The mesa portion 60 shown in FIG. 3 has the emitter region 12 and the base region 14 arranged in contact with the gate trench portion 40. The mesa portion 60 is the mesa portion 60 of the transistor portion 70 or the boundary portion 92.

As described above, when the on voltage is applied to the gate trench portion 40, a channel, which is an inversion layer of electrons, is formed in the portion of the base region 14 in contact with the side wall of the gate trench portion 40. The channel is formed from the emitter region 12 to the drift region 18 or the accumulation region 16 in the Z-axis direction. Thus, carriers flow between the emitter region 12 and the drift region 18.

Figure 4:
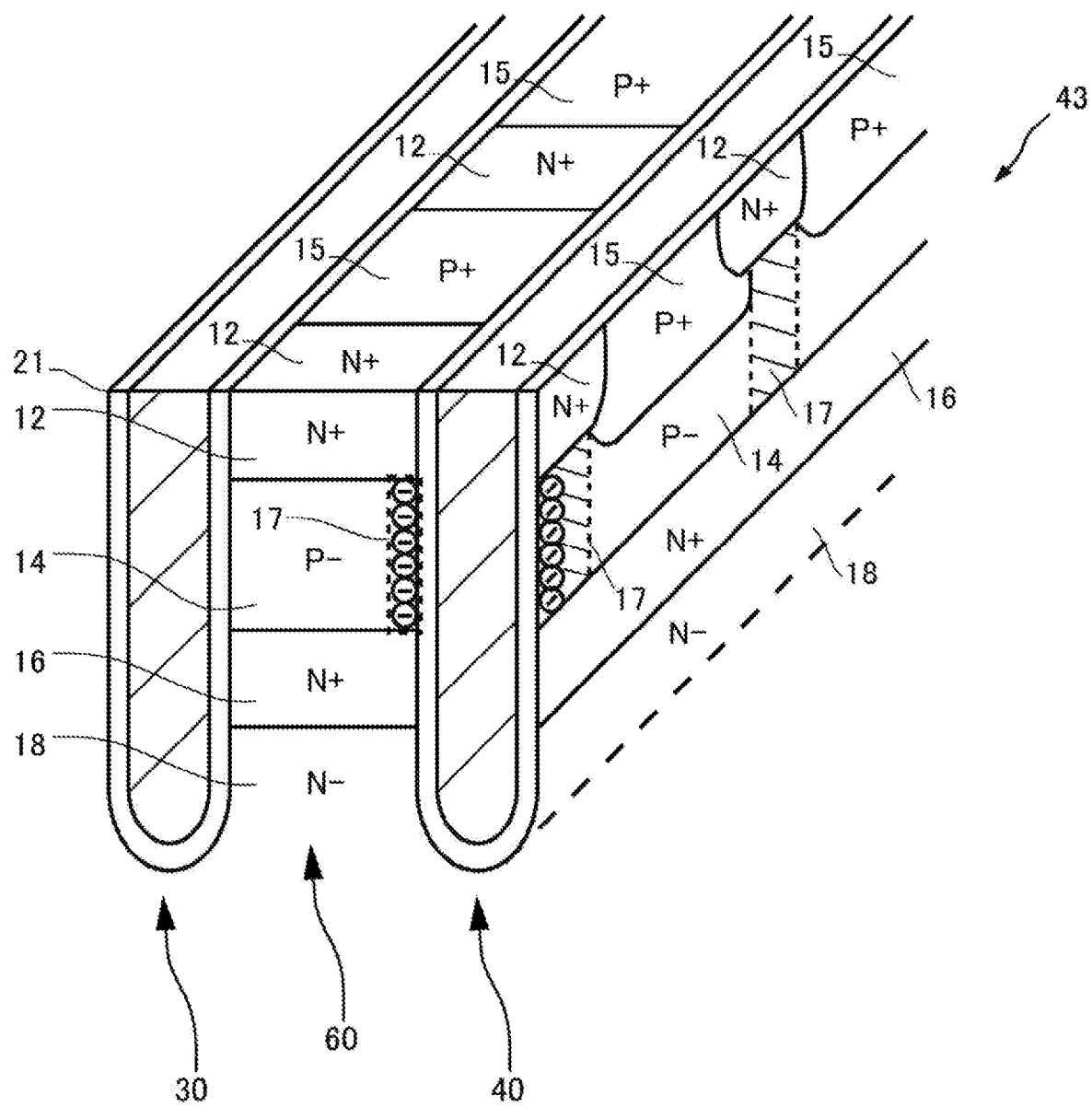
FIG. 4 is a perspective view of a side wall 43 of a gate trench portion 40.

FIG. 4 is a perspective view of a side wall 43 of the gate trench portion 40. The side wall 43 of the gate trench portion 40 may be a surface of the outer wall of the gate trench portion 40 substantially parallel to the YZ plane. The side wall 43 of the gate trench portion 40 may point to a surface of the outer wall of the gate trench portion 40 that can be observed from the X-axis direction.

In FIG. 4, each region of the semiconductor substrate 10 in contact with the side wall 43 of the gate trench portion 40 is indicated by the side wall 43. Also, the channel portion 17 is shown in alignment with the side wall 43. The channel portion 17 may be a region in which a portion in contact with the base region 14 extends to the lower end of the base region 14 in the Z-axis direction of the bottom of the emitter region 12 in contact with the side wall 43 of the gate trench portion 40.

Here, the density (channel density) of the transistor portion 70 and the channel portion 17 of the boundary portion 92 may be, for example, the area of the channel portion 17 formed on the side wall 43 (the YZ plane in the example) of the gate trench portion 40 in the unit area of the upper surface 21 (the XY plane in the example) of the transistor portion 70 or the boundary portion 92. The area of the upper surface 21 of the transistor portion 70 or the boundary portion 92 may be the area of the upper surface of the mesa portion 60, or may be the area of the upper surface of the mesa portion 60 and the trench portion.

As an example, assuming that the total area of the upper surface 21 of the boundary portion 92 is $S_{92}$, and the total area of the channel portion 17 formed on the side wall 43 (the YZ plane in the example) of the gate trench portion 40 in the boundary portion 92 is $S_{ch92}$, the channel density $\alpha_{92}$ of the boundary portion 92 may be $\alpha_{92}=S_{ch92}/S_{92}$. The channel density $\alpha_{92}$ of the boundary portion 92 is a dimensionless value.

The channel density $\alpha_{70}$ of the transistor portion 70 may have the same definition. That is, assuming that the area of the upper surface 21 of the transistor portion 70 is $S_{70}$, and the total area of the channel portion 17 formed on the side wall 43 (the YZ plane in the example) of the gate trench portion 40 of the transistor portion 70 is $S_{ch70}$, the channel density $\alpha_{70}$ of the transistor portion 70 may be $\alpha_{70}=S_{ch70}/S_{70}$. The channel density $\alpha_{70}$ of the transistor portion 70 is a dimensionless value.

Figure 5:
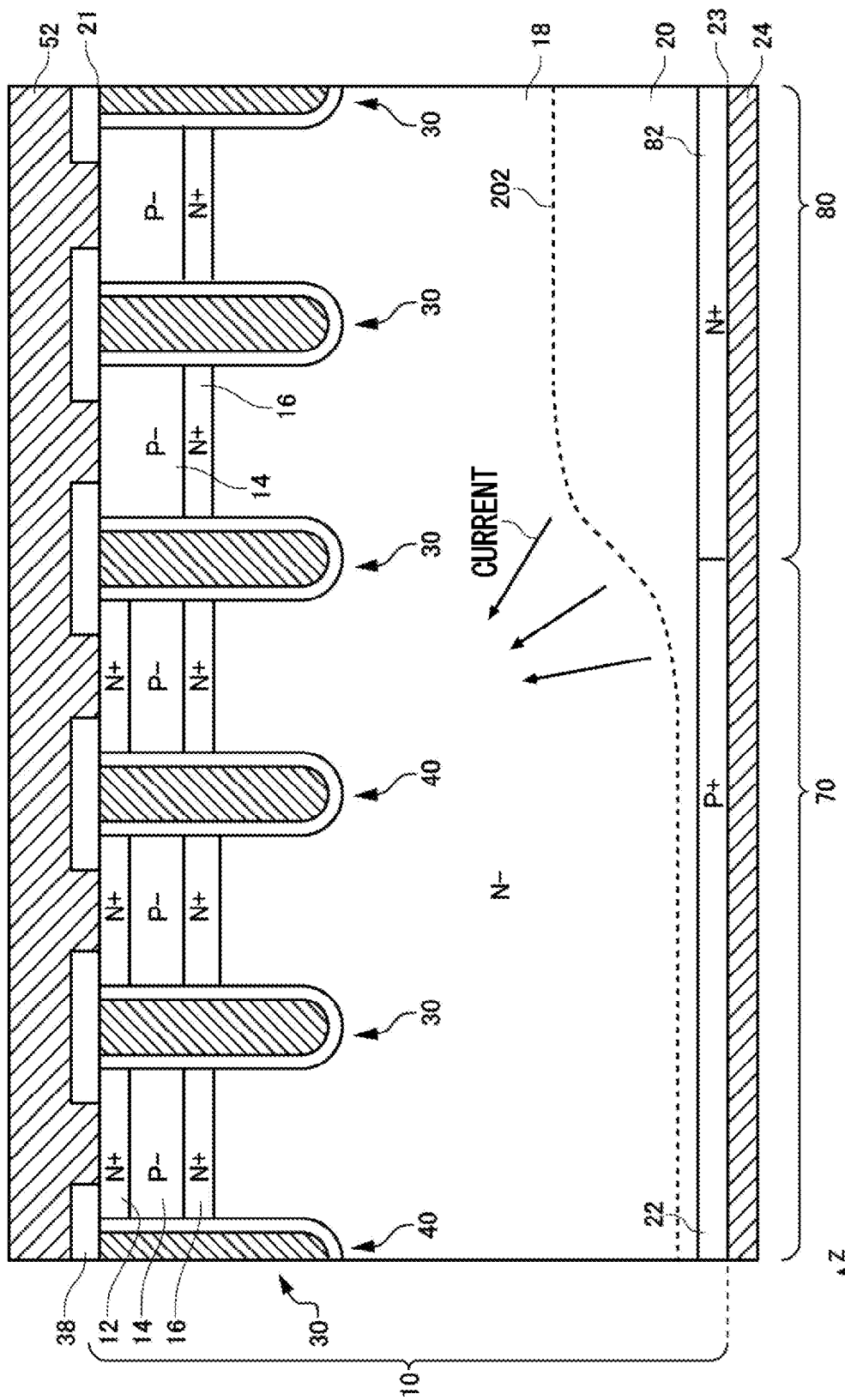
FIG. 5 is a diagram showing an example of the XZ cross section of a semiconductor device 200 which is a comparative example.

FIG. 5 is a diagram showing an example of the XZ cross section of a semiconductor device 200 which is the comparative example. The semiconductor device 200 is different from the semiconductor device 100 in that the boundary portion 92 is not provided. The other structure is the same as that of the semiconductor device 100. The semiconductor device 200 illustrated in FIG. 5 does not include the extraction portion 90, the boundary portion 92, and the suppression portion 94.

The case where a short circuit occurs in the semiconductor device 200 will be examined. The short circuit refers to a phenomenon in which the semiconductor device 200 that should be in the off state is in the on state, and the two semiconductor devices 200 are in the on state simultaneously in circuits including two semiconductor devices 200 connected in series and operating complementarily. In the case of a short circuit, a very large current can flow through the two semiconductor devices 200.

When a short circuit occurs in the semiconductor device 200, a depletion layer 202 spreads to the vicinity of the lower surface of the semiconductor substrate 10 in the transistor portion 70. On the other hand, since almost no carriers exist in the diode portion 80, the width of the depletion layer 202 in the Z-axis direction is smaller than that of the transistor portion 70. In FIG. 5, the lower end of the depletion layer 202 is indicated by a broken line. Therefore, the potential distribution changes sharply at the boundary portion between the transistor portion 70 and the diode portion 80. Therefore, carriers (i.e., current) are concentrated at the boundary portion between the transistor portion 70 and the diode portion 80, and the semiconductor device 200 is easily broken.

On the other hand, according to the semiconductor device 100 described in FIGS. 1A to 2C, the boundary portion 92 is provided between the transistor portion 70 and the diode portion 80. Therefore, the change in the potential distribution between the transistor portion 70 and the diode portion 80 can be made gentle. Therefore, the concentration of the current between the transistor portion 70 and the diode portion 80 can be relaxed, and the concentration of the electric field can also be relaxed.

Also, the channel density of the boundary portion 92 is smaller than the channel density of the transistor portion 70. As a result, the saturation current density of the boundary portion 92 can be made smaller than the saturation current density of the transistor portion 70, so that the carrier density of the region of the boundary portion 92 at the time of short circuit can be smaller than the carrier density of the region of the transistor portion 70. Therefore, the current crowding between the transistor portion 70 and the diode portion 80 can be suppressed. For this reason, destruction of the semiconductor device 100 at the time of short circuit can be suppressed.

Further, the gate trench portion 40 is not provided in the suppression portion 94, and the N-type region is not arranged when viewed from the upper surface of the semiconductor substrate 10. For this reason, an open base transistor is formed in the region of the suppression portion 94. When a voltage applied to the emitter electrode 52 is higher than a voltage applied to the collector electrode 24, the pn junction between the collector region 22 and the buffer region 20 is in a reverse bias.

Since the buffer region 20 has a doping concentration higher than that of the drift region 18 by several orders of magnitude, the pn junction between the collector region 22 and the buffer region 20 may cause an avalanche breakdown. At this time, when the gate voltage is kept higher than the gate threshold voltage, an inversion layer channel of electrons formed at the interface between the gate trench portion 40 and the base region 14 is formed in the transistor portion 70 and the boundary portion 92. Therefore, electrons generated in the avalanche can reach the emitter region 12 through the channel of the boundary portion 92 in contact with the suppression portion 94 in particular. This can prevent destruction of the open base transistor due to the avalanche breakdown.

When a voltage applied to the emitter electrode 52 is higher than a voltage applied to the collector electrode 24, the diode portion 80 is turned on. At this time, when the gate voltage is kept higher than the gate threshold voltage, electrons injected from the cathode region 82 to the drift region 18 pass through the inversion layer channel of the transistor portion 70 and the boundary portion 92 to reach the emitter region 12. As a result, electrons reaching the base region 14 of the diode portion 80 may be reduced, the conductivity modulation may not occur sufficiently, and the forward recovery voltage may increase.

In the semiconductor device 100 of the example, the channel density of the boundary portion 92 is made smaller than the channel density of the transistor portion 70, so that the ratio of electrons escaping to the emitter region 12 can be reduced. As a result, electrons reaching the base region 14 of the diode portion 80 can be increased, the conductivity modulation can be sufficiently generated, and the forward recovery voltage can be reduced. Furthermore, since the semiconductor device 100 of the example is provided with the suppression portion 94 between the boundary portion 92 and the diode portion 80, the ratio of electrons escaping to the emitter region 12 can be made substantially zero. Therefore, sufficient electrons can be supplied to the base region 14 of the diode portion 80, the conductivity modulation can be sufficiently generated, and the forward recovery voltage can be further reduced.

Further, the semiconductor device 100 of the example includes the suppression portion 94 between the boundary portion 92 and the diode portion 80, and the suppression portion 94 is mainly provided with the base region 14 having a concentration lower than that of the contact region 15. For this reason, injection of holes from the base region 14 of the suppression portion 94 is significantly suppressed as compared with the transistor portion 70, the extraction portion 90, and the boundary portion 92. Further, due to the presence of the suppression portion 94, the distance from the contact region 15 of the transistor portion 70, the extraction portion 90 and the boundary portion 92 to the cathode region 82 of the diode portion 80 is long. Furthermore, since the gate voltage is kept higher than the gate threshold voltage, the transistor portion 70 and the boundary portion 92 is made to an emitter short transistor made by the emitter region 12 and the inversion layer channel of electrons. For this reason, injection of holes from the contact region 15 of the transistor portion 70 and the boundary portion 92 is also largely suppressed. Thus, the influence of the contact region 15 of the transistor portion 70, the extraction portion 90 and the boundary portion 92 increasing the reverse recovery peak current of the diode portion can be sufficiently suppressed.

Also, by providing the extraction portion 90 whose area of the contact region 15 is large between the transistor portion 70 and the diode portion 80, holes between the transistor portion 70 and the diode portion 80 can be extracted efficiently at the time of switching of the semiconductor device 100, etc.

Figure 6:
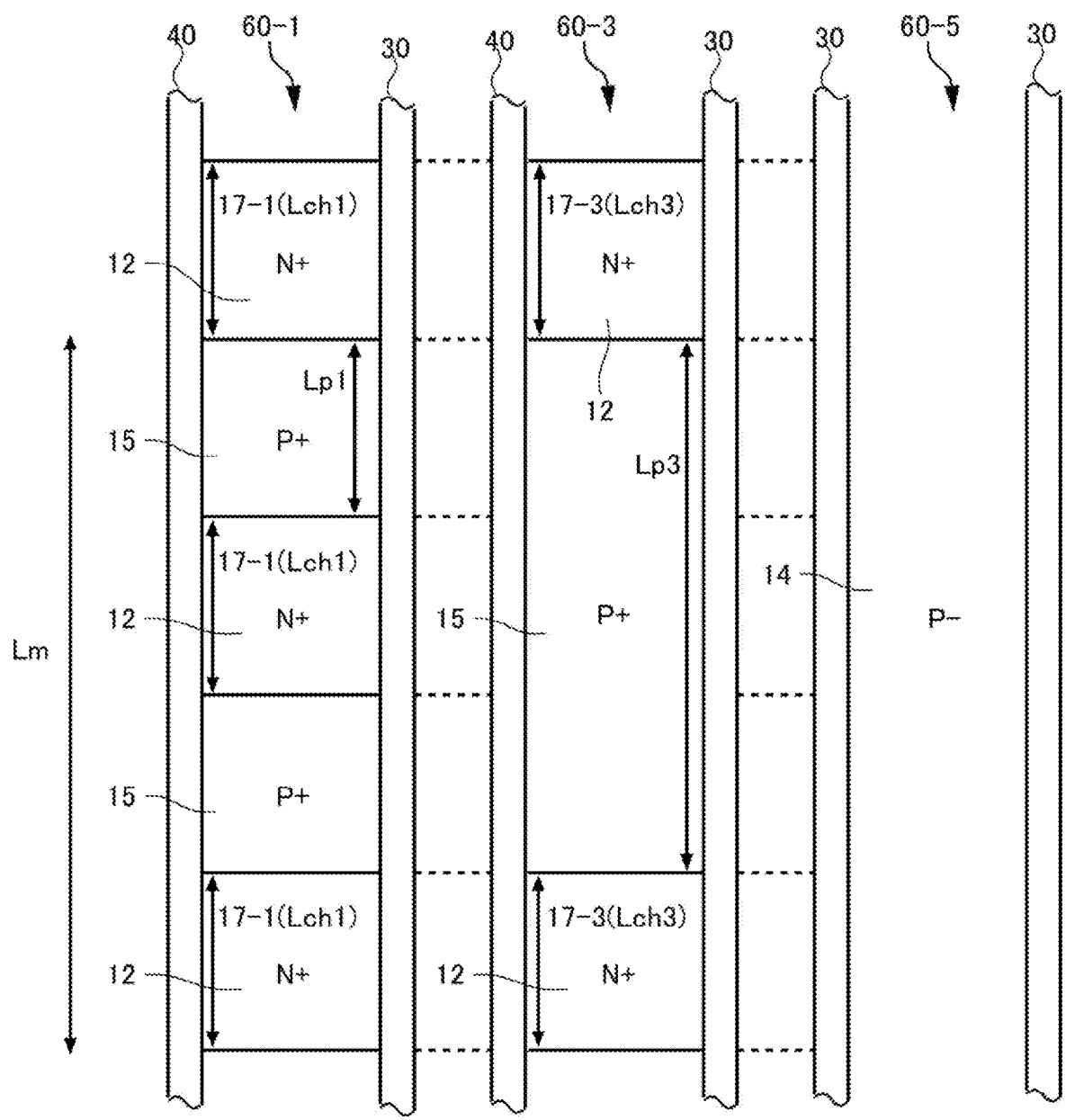
FIG. 6 is a diagram showing an arrangement example of a doping region at the upper surfaces of a mesa portion 60-1 of the transistor portion 70, a mesa portion 60-3 of the boundary portion 92, and a mesa portion 60-5 of the diode portion 80.

FIG. 6 is a diagram showing an arrangement example of the doping region at the upper surface of the mesa portion 60-1 of the transistor portion 70, the mesa portion 60-3 of the boundary portion 92, and the mesa portion 60-5 of the diode portion 80. In the example, the mesa portion 60-1, the mesa portion 60-3 and the mesa portion 60-5 are partially shown one by one, and the other mesa portions 60 are omitted. In the example, a portion in which the emitter region 12 is in contact with the gate trench portion 40 at the upper surface of the mesa portion 60 is referred to as the channel portion 17.

As described above, the channel density of each mesa portion 60-3 of the boundary portion 92 is smaller than the channel density of each mesa portion 60-1 of the transistor portion 70. The channel density of each mesa portion 60 may refer to the total length of the channel portion 17 included in a predetermined unit area at the upper surface of the mesa portion 60 as an example, in addition to the above definition. When the width of each mesa portion 60 in the X-axis direction is the same, the channel density may refer to the total length of the channel portion 17 with respect to the unit length of the upper surface of the mesa portion 60. In the example of FIG. 6, when the unit length of the mesa portion 60 is Lm, the channel density of the mesa portion 60-1 is 2×Lch1/Lm, and the channel density of the mesa portion 60-3 is Lch3/Lm.

The channel density of each mesa portion 60-3 of the boundary portion 92 may be 10% or more and 90% or less of the channel density of each mesa portion 60-1 of the transistor portion 70. Thereby, the change in the channel density between the transistor portion 70 and the diode portion 80 can be made gentle. The channel density of each mesa portion 60-3 of the boundary portion 92 may be 30% or more and 70% or less, or 40% or more and 60% or less of the channel density of each mesa portion 60-1 of the transistor portion 70. This can make the change in channel density more gentle.

The number of the mesa portions 60-3 included in the boundary portion 92 may be larger than the number of the mesa portions 60-2 included in the extraction portion 90. For example, one mesa portion 60-2 is included in the extraction portion 90, and a plurality of mesa portions 60-3 is included in the boundary portion 92. The number of the mesa portions 60-4 included in the suppression portion 94 may be larger than the number of the mesa portions 60-2 included in the extraction portion 90. For example, one mesa portion 60-2 is included in the extraction portion 90, and a plurality of mesa portions 60-4 is included in the suppression portion 94.

As shown in FIG. 6, the emitter regions 12 and the contact regions 15 are alternately arranged along the longitudinal direction (the Y-axis direction) of the trench portion at the upper surface of the mesa portion 60 of the transistor portion 70 and the boundary portion 92. The length Lp3 of each contact region 15 in the Y-axis direction provided in the mesa portion 60-3 of the boundary portion 92 may be larger than the length Lp1 of each contact region 15 in the Y-axis direction provided in the mesa portion 60-1 of the transistor portion 70. Thereby, the channel density of the boundary portion 92 can be reduced. The length Lp3 may be two or more times, or three or more times the length Lp1.

At the upper surface of the mesa portion 60, the length Lch1 of one emitter region 12 of the transistor portion 70 may be identical to the length Lch3 of one emitter region 12 of the boundary portion 92. As a result, since the boundary portion 92 is obtained by subtracting the emitter region 12 of the transistor portion 70, the boundary portion 92 can be easily formed.

Figure 7:
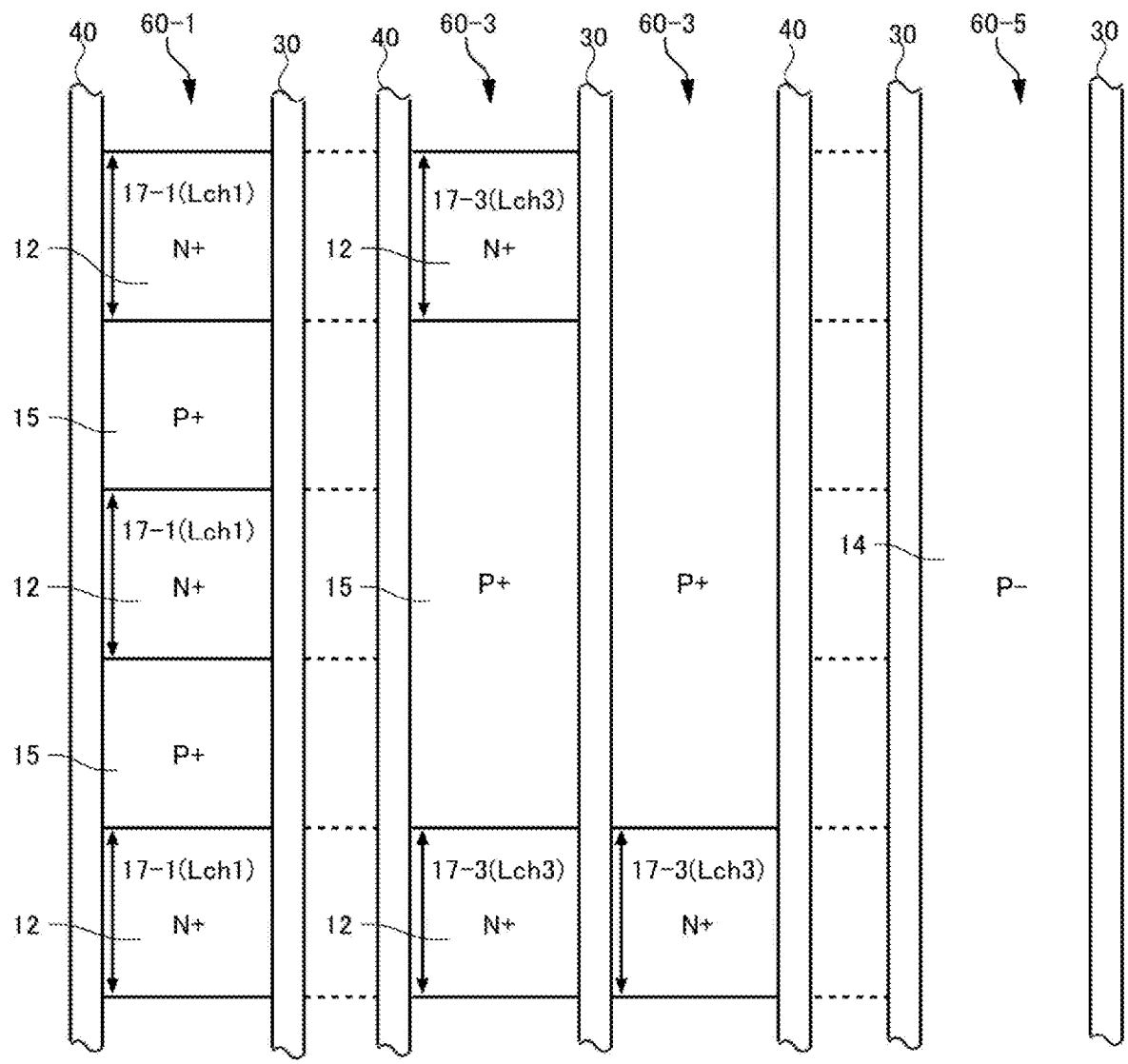
FIG. 7 is a diagram showing another arrangement example of the doping region in each mesa portion 60.

FIG. 7 is a diagram showing another arrangement example of the doping region in each mesa portion 60. In the example, the arrangement of the doping region in the boundary portion 92 is different from those of the examples described in FIGS. 1A to 6. The structure other than the boundary portion 92 may be identical to any of the examples described in FIGS. 1A to 6.

The boundary portion 92 of the example has two or more mesa portion 60-3 at the upper surface of the semiconductor substrate 10. In the example, a density of the channel portion 17 of a mesa portion 60-3 of the boundary portion 92 is small as the mesa portion 60-3 is close to the diode portion 80, compared with the other mesa portions 60-3. For example, the channel density of one mesa portion 60-3 is half the channel density of the transistor portion 70, and the channel density of the mesa portion 60-3 provided closer to the diode portion 80 than the mesa portion 60-3 is ¼ the channel density of the mesa portion 60-1 of the transistor portion 70. Such a structure can make the change in channel density more gentle.

Figure 8:
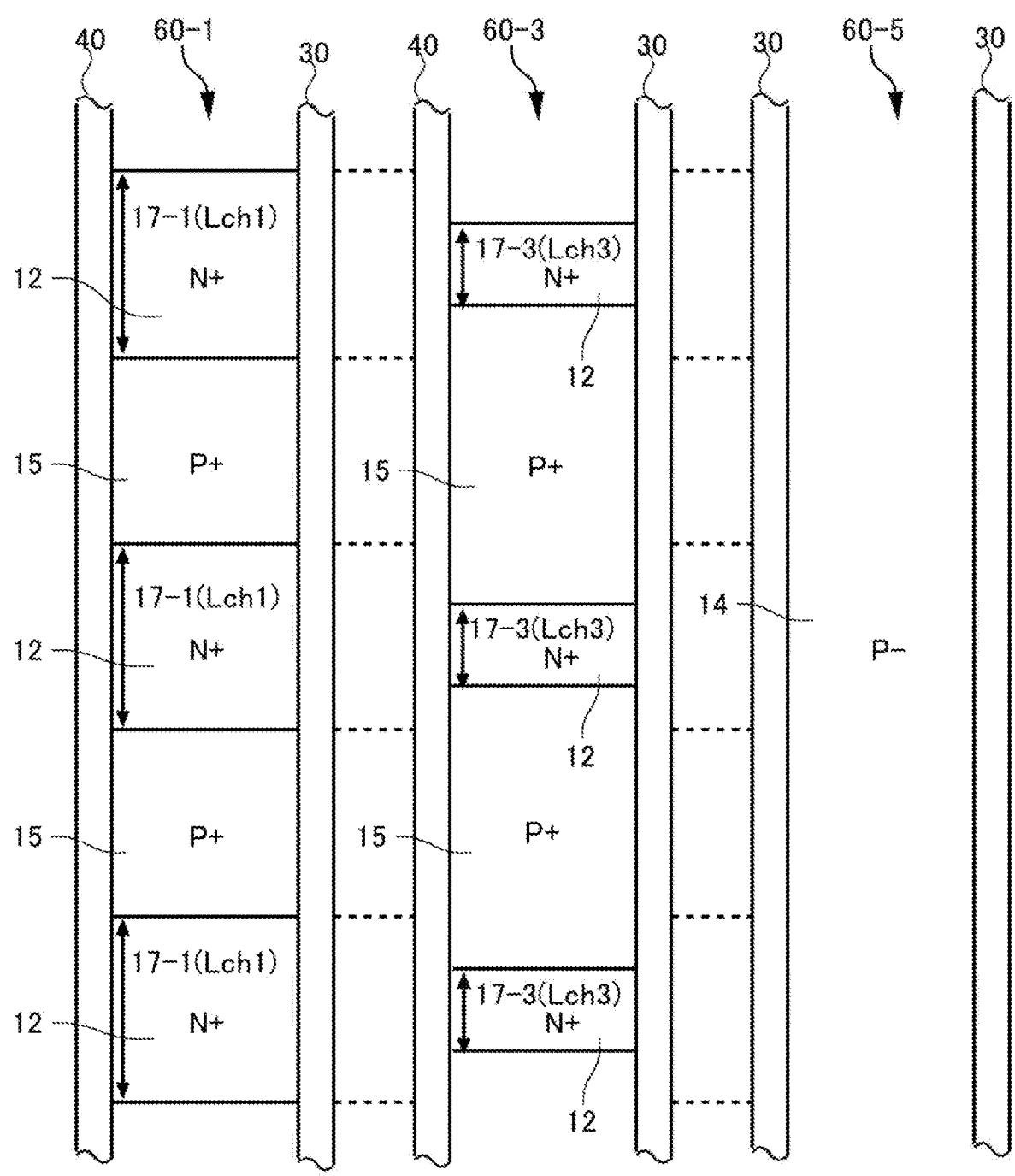
FIG. 8 is a diagram showing another arrangement example of the doping region in each mesa portion 60.

FIG. 8 is a diagram showing another arrangement example of the doping region in each mesa portion 60. In the example, the length Lch3 of one emitter region 12 in the boundary portion 92 is different from that of the examples described in FIGS. 1A to 7. The structure other than the length Lch3 of the emitter region 12 may be identical to any of the examples described in FIGS. 1A to 7.

In the example, the length Lch3 of the emitter region 12 of the boundary portion 92 is smaller than the length Lch1 of the emitter region 12 of the transistor portion 70. Such a structure also allows the channel density of the boundary portion 92 to be easily reduced. The length Lch3 may be 80% or less, or 50% or less of the length Lch1.

A period on the Y-axis in which the emitter regions 12 of the transistor portion 70 are repeatedly arranged may be identical to or different from a period on the Y-axis in which the emitter regions 12 of the boundary portion 92 are repeatedly arranged. In the example of FIG. 8, the emitter regions 12 of the transistor portion 70 and the emitter regions 12 of the boundary portion 92 correspond one to one, and the corresponding emitter regions 12 are arranged at opposing positions in the X-axis direction. "Opposing in the X-axis direction" means that when one emitter region 12 extends along the X-axis, it at least partially overlaps the other emitter region 12.

Figure 9:
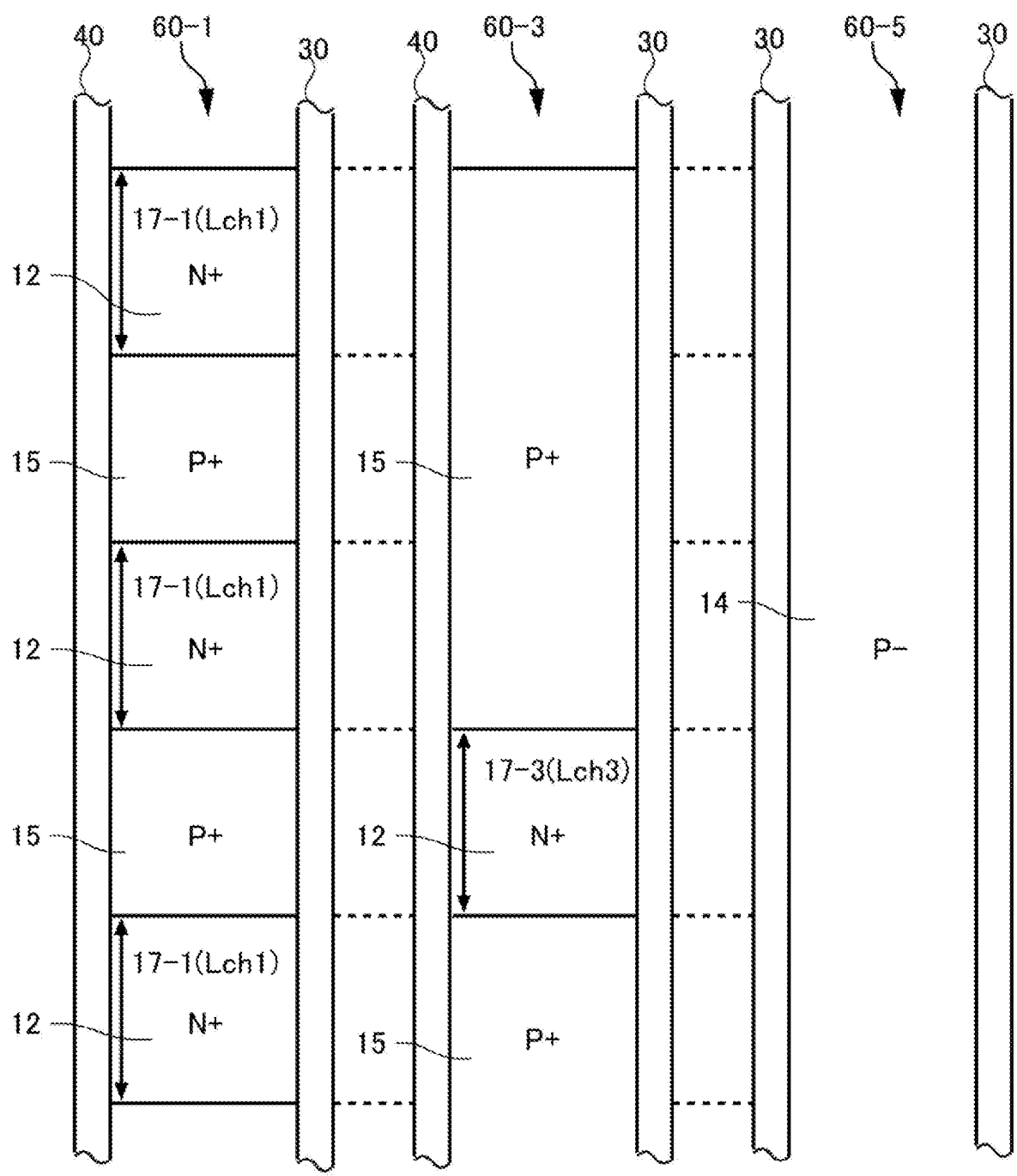
FIG. 9 is a diagram showing another arrangement example of the doping region in each mesa portion 60.

FIG. 9 is a diagram showing another arrangement example of the doping region in each mesa portion 60. In the example, the arrangement of the emitter region 12 in the boundary portion 92 is different from that of the examples described in FIGS. 1A to 8. The structure other than the arrangement of the emitter region 12 may be identical to any of the examples described in FIGS. 1A to 8.

In the example at the upper surface of the semiconductor substrate 10, the emitter region 12 in the mesa portion 60-3 of the boundary portion 92 is arranged at a position facing the P-type region (the contact region 15 in the example) of the mesa portion 60-1 of the transistor portion 70. The emitter region 12 in boundary portion 92 may be arranged at a position not facing the emitter region 12 of transistor portion 70. In the Y-axis direction, the emitter region 12 in boundary portion 92 may have the same length as, or may have a shorter length than the contact region 15 of transistor portion 70. With such a structure, the channel portion 17 can be prevented from being unevenly arranged at a predetermined position in the Y-axis direction, and the change in potential distribution in the Y-axis direction can be made gentle. In the case where the boundary portion 92 has a plurality of mesa portions 60-3, it is preferable that the emitter regions 12 in the adjacent mesa portions 60-3 be arranged to be offset in the Y-axis direction.

Figure 10:
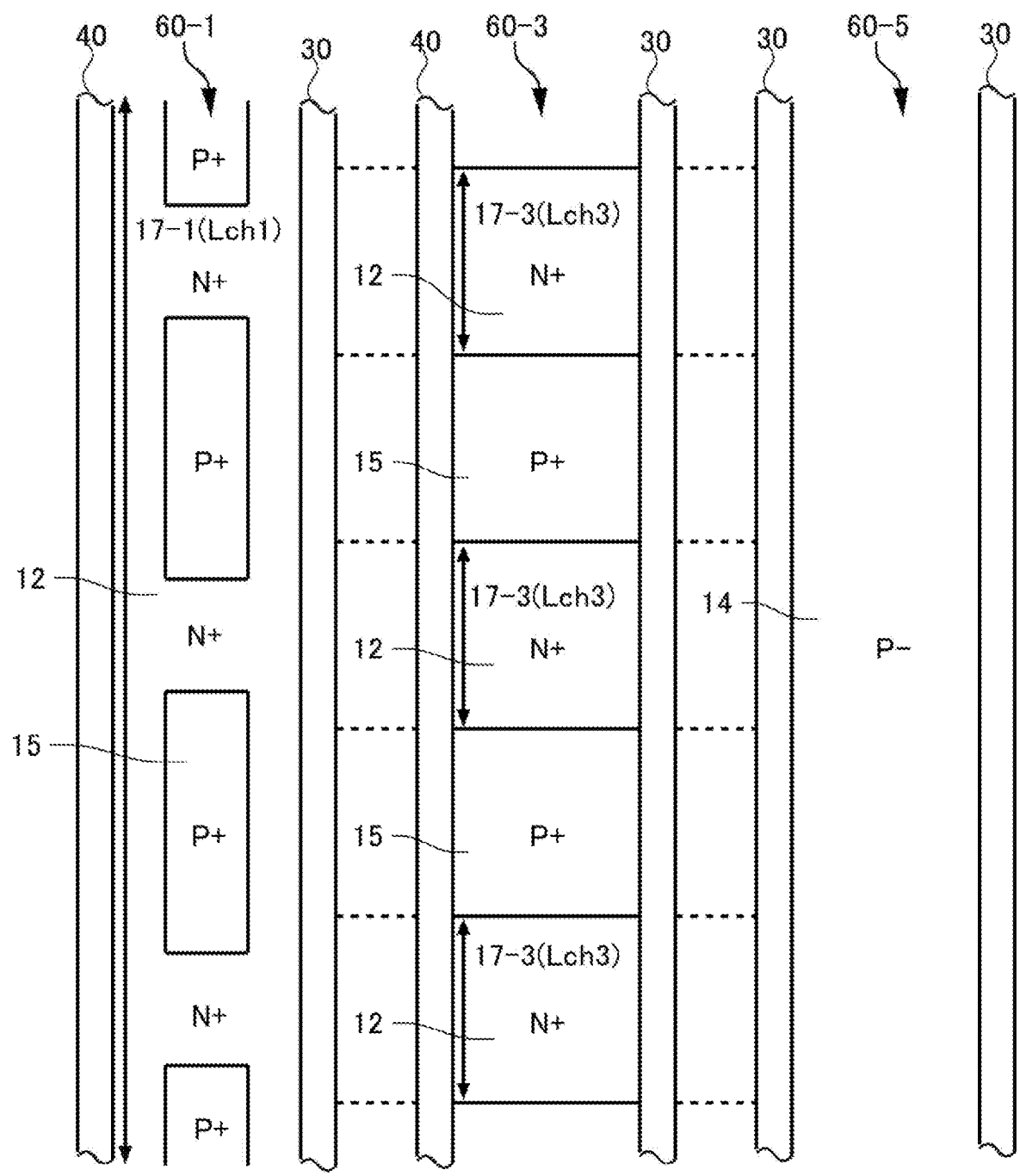
FIG. 10 is a diagram showing another arrangement example of the doping region in each mesa portion 60.

FIG. 10 is a diagram showing another arrangement example of the doping region in each mesa portion 60. In the example, the arrangement of the doping region at the upper surface of the mesa portion 60-1 of the transistor portion 70 is different from that of the examples described in FIGS. 1A to 9. The structure other than the arrangement of the doping region of the transistor portion 70 may be identical to any of the examples described in FIGS. 1A to 9.

In the example, one emitter region 12 in contact with the gate trench portion 40 is continuously provided along the Y-axis direction at the upper surface of each mesa portion 60-1 of the transistor portion 70. That is, the emitter region 12 is not provided separately at the upper surface of the mesa portion 60-1.

In the example of FIG. 10, the contact regions 15 are arranged apart from both the gate trench portion 40 and the dummy trench portion 30 at the upper surface of each mesa portion 60-1 of the transistor portion 70. The contact regions 15 are discretely arranged along the Y-axis direction. The emitter regions 12 are formed in the region in contact with the gate trench portion 40, the region in contact with the dummy trench portion 30, and the region between the respective contact regions 15 at the upper surface of the mesa portion 60-1.

On the other hand, the emitter regions 12 in contact with gate trench portion 40 are discretely arranged along the Y-axis direction at the upper surface of mesa portion 60-3 of boundary portion 92. Such a structure also allows the channel density of the boundary portion 92 to be easily made smaller than that of the transistor portion 70.

Figure 11:
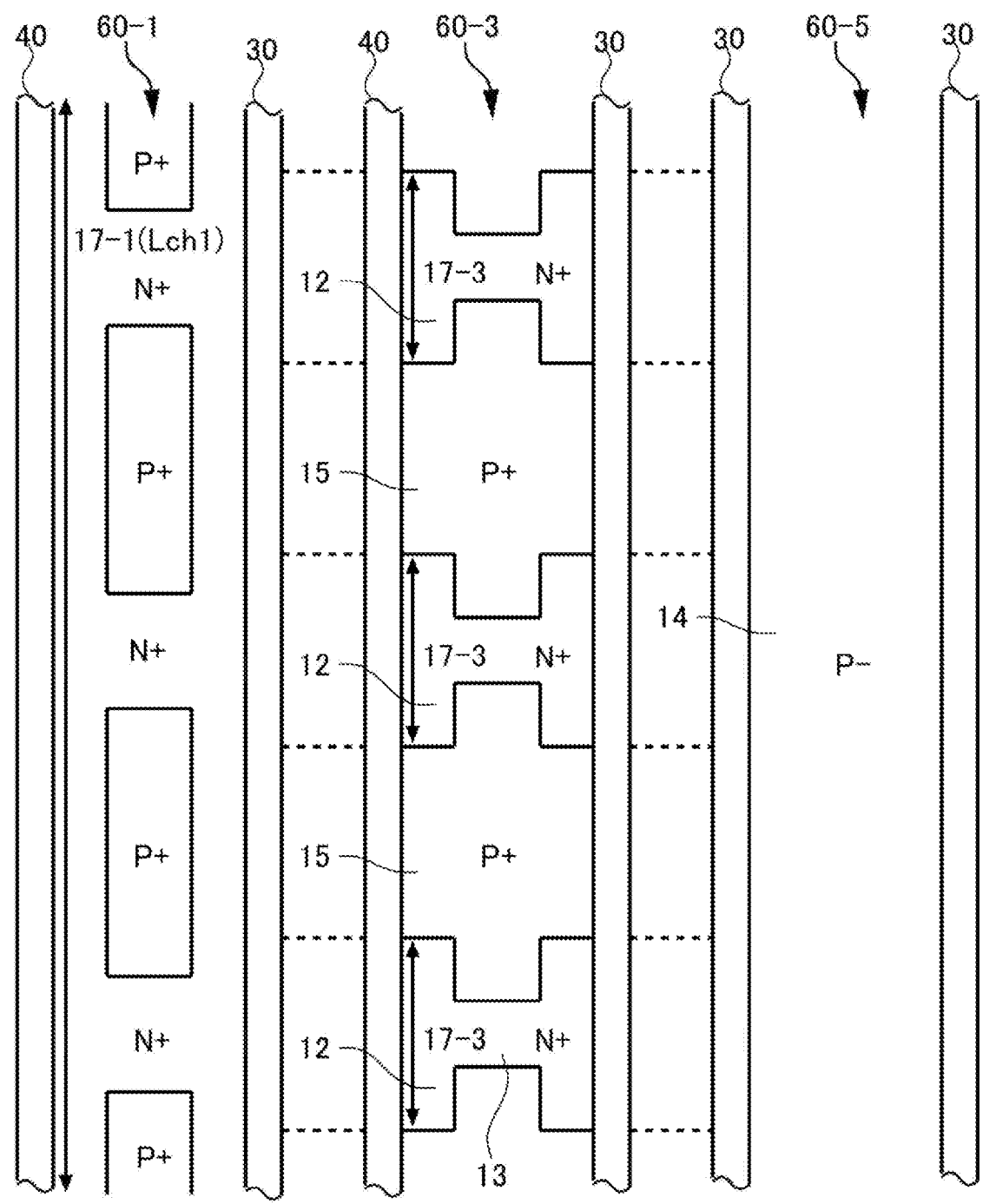
FIG. 11 is a diagram showing another arrangement example of the doping region in each mesa portion 60.

FIG. 11 is a diagram showing another arrangement example of the doping region in each mesa portion 60. In the example, the shape of the emitter region 12 at the upper surface of the mesa portion 60-3 in the boundary portion 92 is different from that of the examples described in FIGS. 1A to 10. The structure other than the shape of the emitter region 12 at the upper surface of the mesa portion 60-3 may be identical to any of the examples described in FIGS. 1A to 10.

In the example, the emitter region 12 at the upper surface of the mesa portion 60-3 has a narrowed portion 13 whose length in the Y-axis direction is shorter than that of a channel portion 17-3. The narrowed portion 13 may be arranged at a position overlapping the contact hole 54 shown in FIGS. 1B and 2A. By providing the narrowed portion 13, the area of the contact region 15 connected to the emitter electrode 52 via the contact hole 54 can be increased. Therefore, the hole extraction efficiency can be improved at the boundary portion 92.

Figure 12:
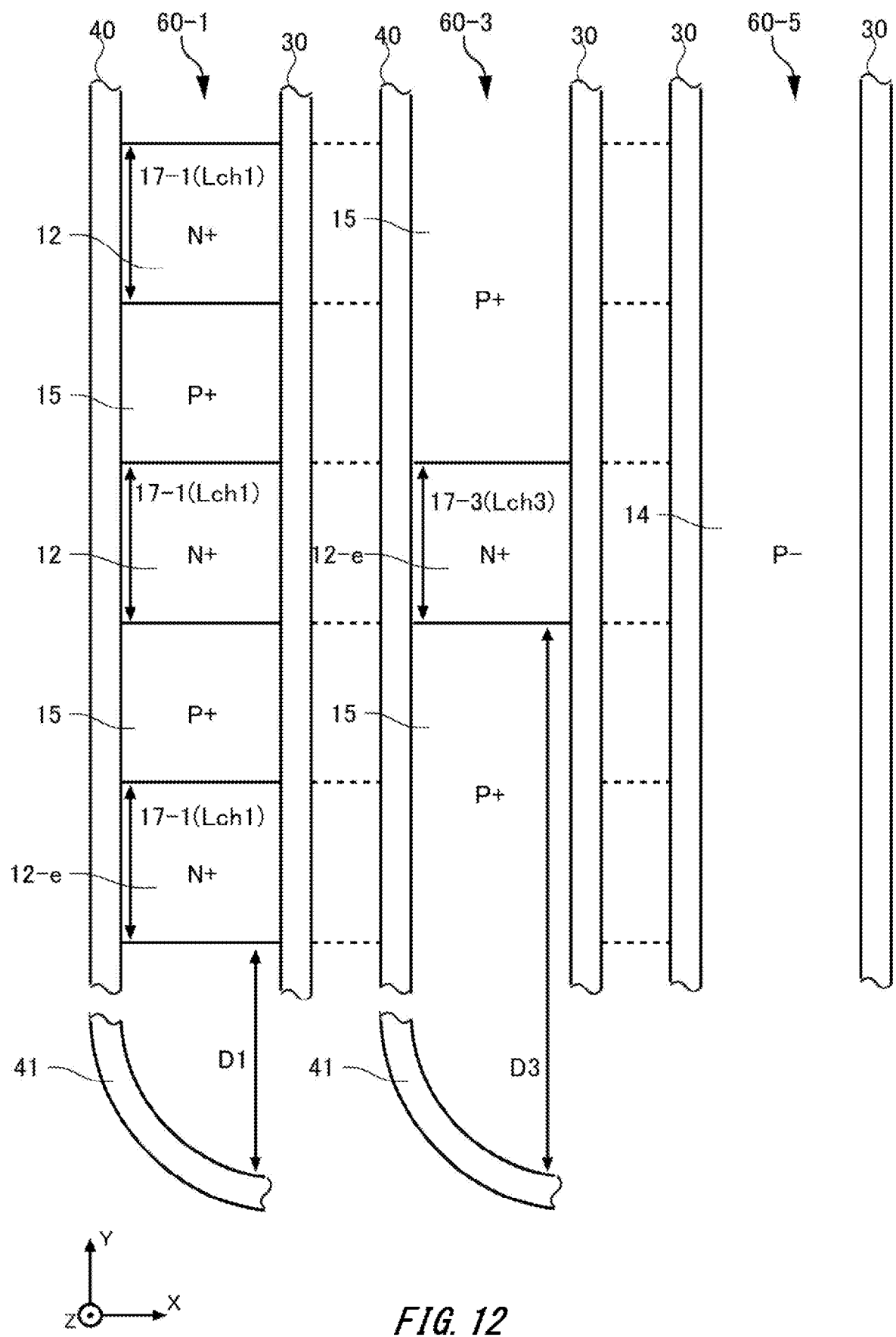
FIG. 12 is a diagram showing another arrangement example of the doping region in each mesa portion 60.

FIG. 12 is a diagram showing another arrangement example of the doping region in each mesa portion 60. In the example, the arrangement of the emitter region 12 at the upper surface of the mesa portion 60-3 in the boundary portion 92 is different from that of the examples described in FIGS. 1A to 11. The structure other than the arrangement of the emitter region 12 at the upper surface of the mesa portion 60-3 may be identical to any of the examples described in FIGS. 1A to 11.

In each mesa portion 60, the emitter region 12 arranged at the most end in the Y-axis direction is taken as an emitter region 12-e. In the example the emitter region 12-e in mesa portion 60-3 of boundary portion 92 is arranged closer to the center of mesa portion 60 in the Y-axis direction than the emitter region 12-e in mesa portion 60-1 of transistor portion 70. For example, a distance D3 between the emitter region 12-e of the boundary portion 92 and the edge portion 41 of the gate trench portion 40 in the Y-axis direction is larger than a distance D1 between the emitter region 12-e of the transistor portion 70 and the edge portion 41 of the gate trench portion 40 in the Y-axis direction. The difference between the distance D3 and the distance D1 may be larger than the length Lch1 of the emitter region 12, and may be twice or more the Lch1.

Further, in the case where the boundary portion 92 has a plurality of mesa portions 60-3, the emitter region 12-e may be arranged closer to the center of the mesa portion 60 in the mesa portion 60-3 closer to the diode portion 80. With such a structure, the range in which the channel portion 17 is arranged in the XY plane can be gradually converged as the diode portion 80 is approached.

Figure 13:
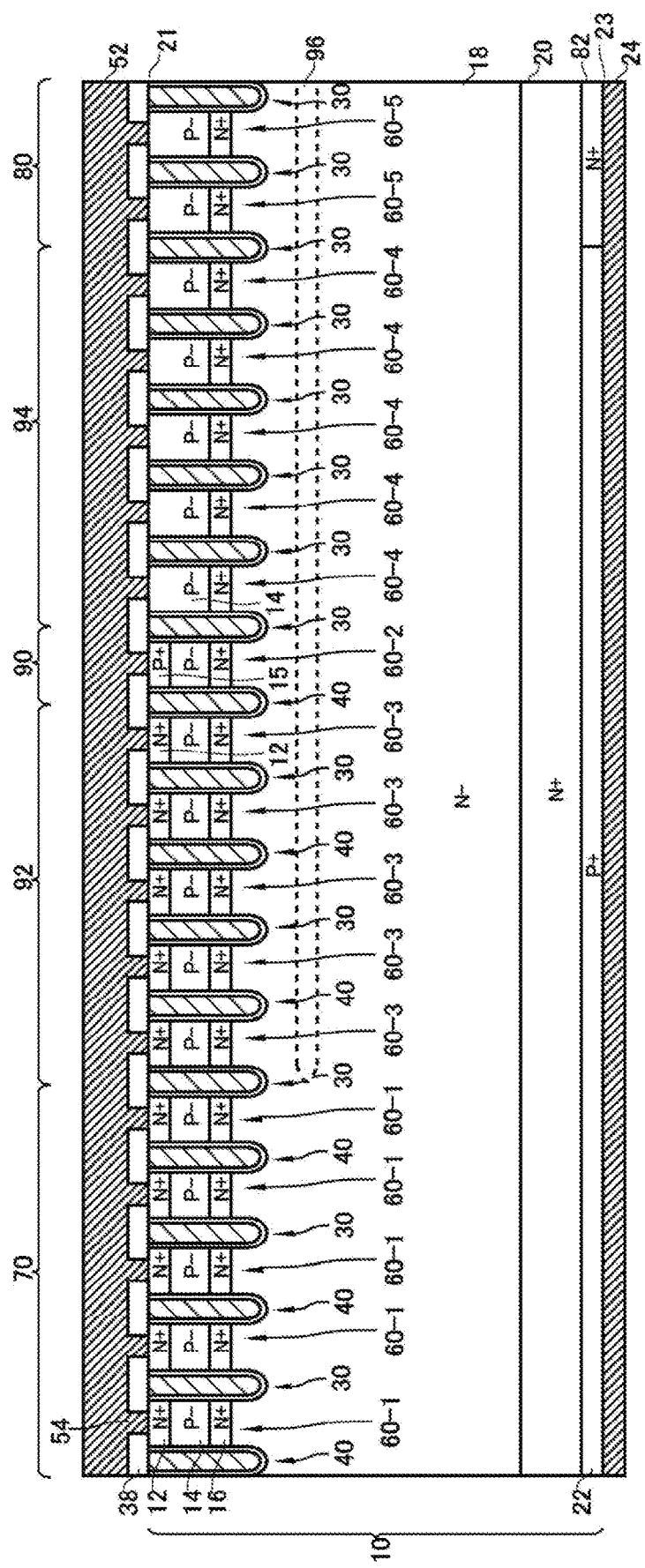
FIG. 13 is a diagram showing another example of the a-a' cross section of the semiconductor device 100.

FIG. 13 is a diagram showing another example of the a-a' cross section of the semiconductor device 100. The semiconductor device 100 of the example has the arrangement of the extraction portion 90 different from that of the examples described in FIG. 1A to FIG. 12. The structure other than the arrangement of the extraction portion 90 may be identical to any of the examples described in FIGS. 1A to 12.

The extraction portion 90 of the example is arranged between the boundary portion 92 and the diode portion 80 in the X-axis direction. The extraction portion 90 may be arranged between the boundary portion 92 and the suppression portion 94. In this case, the boundary portion 92 is arranged in contact with the transistor portion 70. By arranging the extraction portion 90 having no channel portion 17 at the upper surface of the mesa portion 60-2 between the boundary portion 92 and the diode portion 80, the channel density can be changed continuously between the boundary portion 92 and the diode portion 80. Therefore, the change in the potential distribution can be made more gentle.

Figure 14:
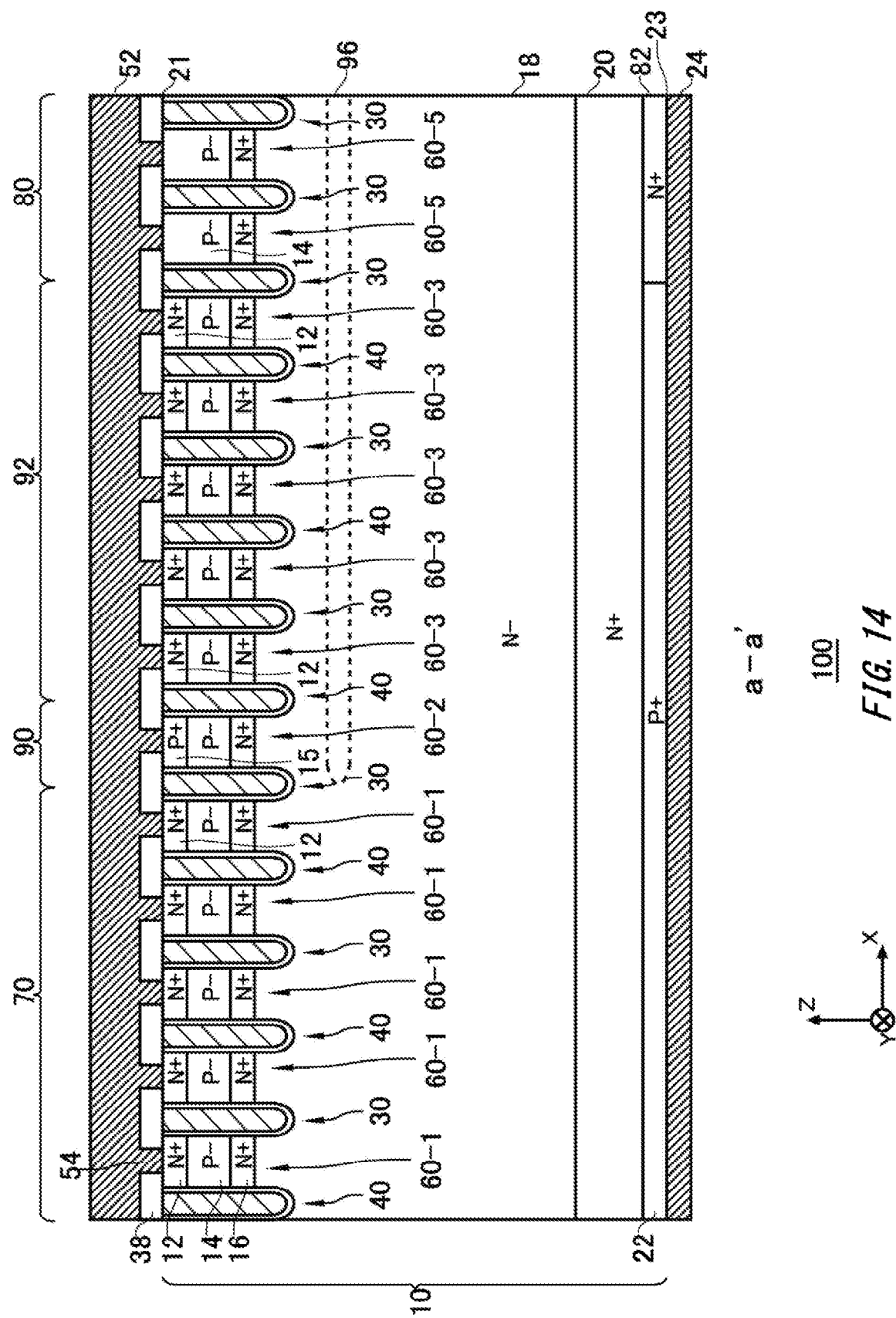
FIG. 14 is a diagram showing another example of the a-a' cross section of the semiconductor device 100.

FIG. 14 is a diagram showing another example of the a-a' cross section of the semiconductor device 100. The semiconductor device 100 of the example is different from the examples described in FIGS. 1A to 13 in that the semiconductor device 100 does not have the suppression portion 94. The structure other than the suppression portion 94 may be identical to any of the examples described in FIGS. 1A to 13. Further, the semiconductor device 100 may have the suppression portion 94 and may not have the extraction portion 90. In addition, the semiconductor device 100 may not have the extraction portion 90 or the suppression portion 94.

Figure 15:
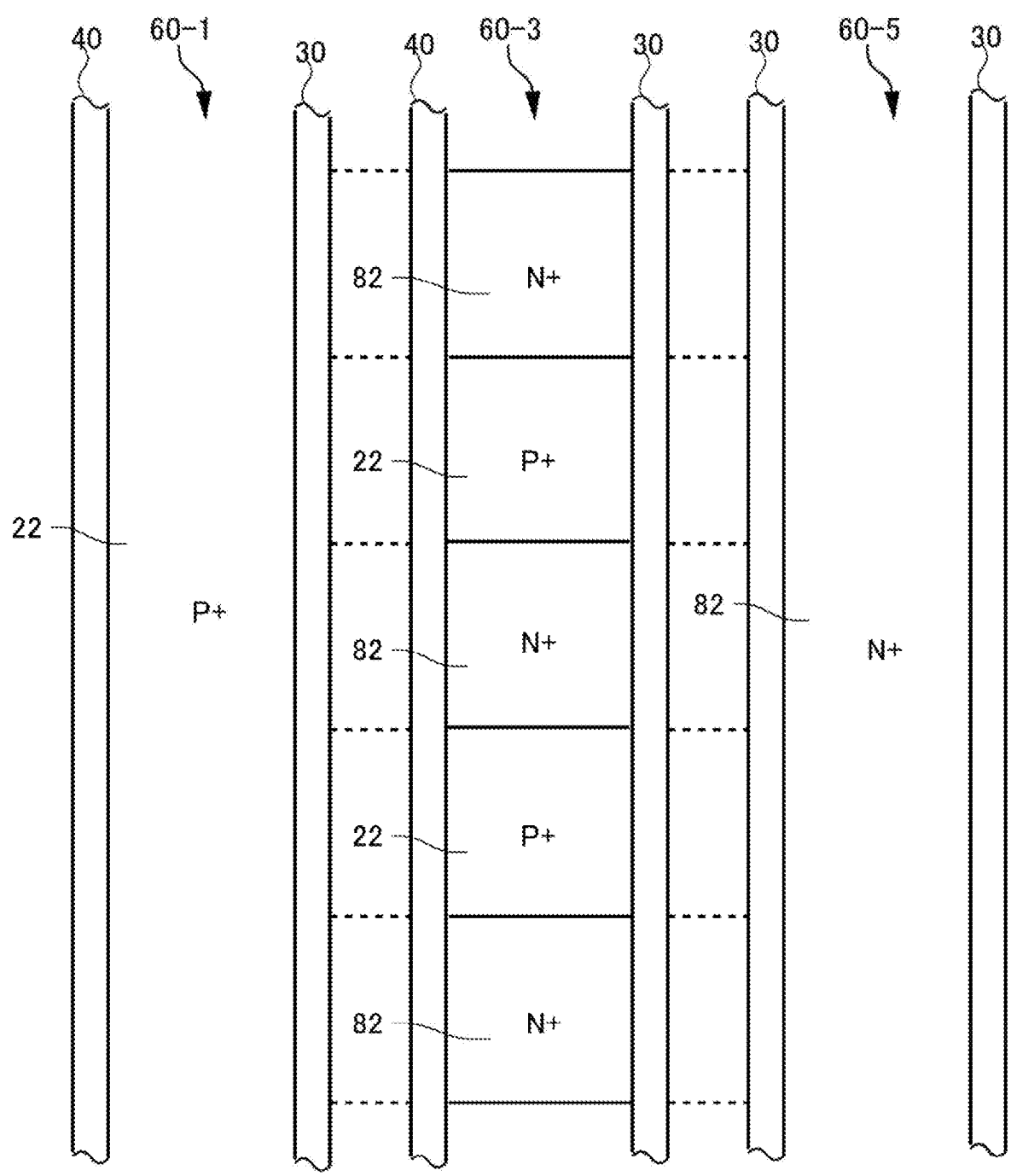
FIG. 15 is a diagram showing an arrangement example of a collector region 22 and a cathode region 82 in the XY plane.

FIG. 15 is a diagram showing an arrangement example of the collector region 22 and the cathode region 82 in the XY plane. In the example shown in FIG. 1A, the cathode region 82 is not provided except for the diode portion 80. In the example, the collector regions 22 and the cathode regions 82 are alternately arranged in the mesa portion 60-3 of the boundary portion 92 along the Y-axis direction. With such a structure, the carrier density of the boundary portion 92 can be reduced, and the current density concentrated between the transistor portion 70 and the diode portion 80 can be reduced.

Figure 16:
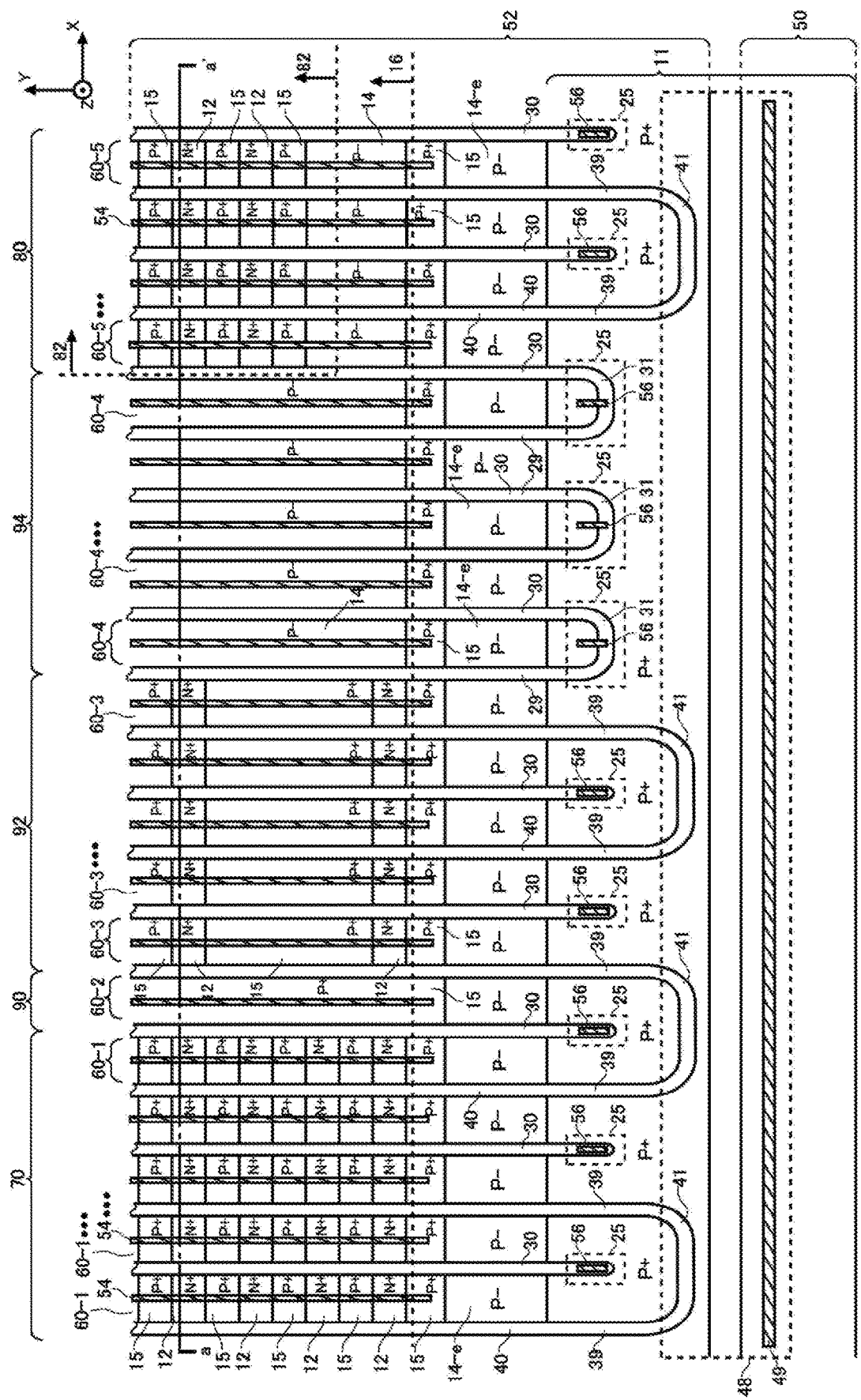
FIG. 16 is a diagram showing another example of the upper surface of the semiconductor device 100.

FIG. 16 is a diagram showing another example of the upper surface of the semiconductor device 100. The structure of the diode portion 80 of the semiconductor device 100 in the example is different from that of the semiconductor device 100 described in FIGS. 1A to 15. The structure other than the diode portion 80 may be identical to that of the semiconductor device 100 according to any one of the aspects described in FIGS. 1A to 15.

The diode portion 80 of the example includes the gate trench portion 40. The structure of the gate trench portion 40 is identical to that of the gate trench portion 40 of the transistor portion 70. The ratio of the dummy trench portion 30 to all the trench portions of the transistor portion 70 may be identical to the ratio of the dummy trench portion 30 to all the trench portions of the diode portion 80, or the ratio of the dummy trench portion 30 of the diode portion 80 may be higher than that of the transistor portion 70. The diode portion 80 includes the emitter region 12 and the contact region 15 in the mesa portion 60-5 in contact with the gate trench portion 40. The structure of the emitter region 12 and the contact region 15 is the same as that of the emitter region 12 and the contact region 15 of the transistor portion 70.

The channel density of the diode portion 80 may be smaller than the channel density of the transistor portion 70. The area of the emitter region 12 provided in one mesa portion 60-5 may be smaller than the area of the emitter region 12 provided in one mesa portion 60-1 of the transistor portion 70. The mesa portion 60-5 of the diode portion 80 may have the base region 14 instead of any one or more of the plurality of emitter regions 12 provided in the mesa portion 60-1 of the transistor portion 70. The mesa portion 60-5 shown in FIG. 16 includes the base region 14 instead of the one or more emitter regions 12 provided at the most end of the mesa portion 60-1 in the Y-axis direction.

The channel density of the diode portion 80 may be larger than the channel density of the boundary portion 92. The area of the emitter region 12 provided in one mesa portion 60-5 may be larger than the area of the emitter region 12 provided in one mesa portion 60-3 of the boundary portion 92.

In addition, the area of the contact region 15 provided in one mesa portion 60-5 may be smaller than the area of the contact region 15 provided in one mesa portion 60-1 of the transistor portion 70. The mesa portion 60-5 of the diode portion 80 may include the base region 14 instead of any one or more of the plurality of contact regions 15 provided in the mesa portion 60-1 of the transistor portion 70. The mesa portion 60-5 shown in FIG. 16 includes the base region 14 instead of the one or more emitter regions 12 and the one or more contact regions 15 continuous in the mesa portion 60-1 in the Y-axis direction.

The emitter region 12 provided in diode portion 80 may be arranged in a region where the cathode region 82 is projected onto the upper surface 21. This can prevent the diode portion 80 from operating as a transistor. In the example of FIG. 16, the emitter region 12 is provided also in the mesa portion 60-5 closest to the transistor portion 70 in the diode portion 80. In another example, the emitter region 12 may not be provided in the mesa portion 60-5.

The trench portion closest to the transistor portion 70 in the diode portion 80 may be the dummy trench portion 30. Such a structure can also prevent the diode portion 80 from operating as a transistor. The gate trench portion 40 provided in the diode portion 80 in the X-axis direction may be arranged in a region where the cathode region 82 is projected perpendicularly onto the upper surface of the semiconductor substrate 10.

Figure 17:
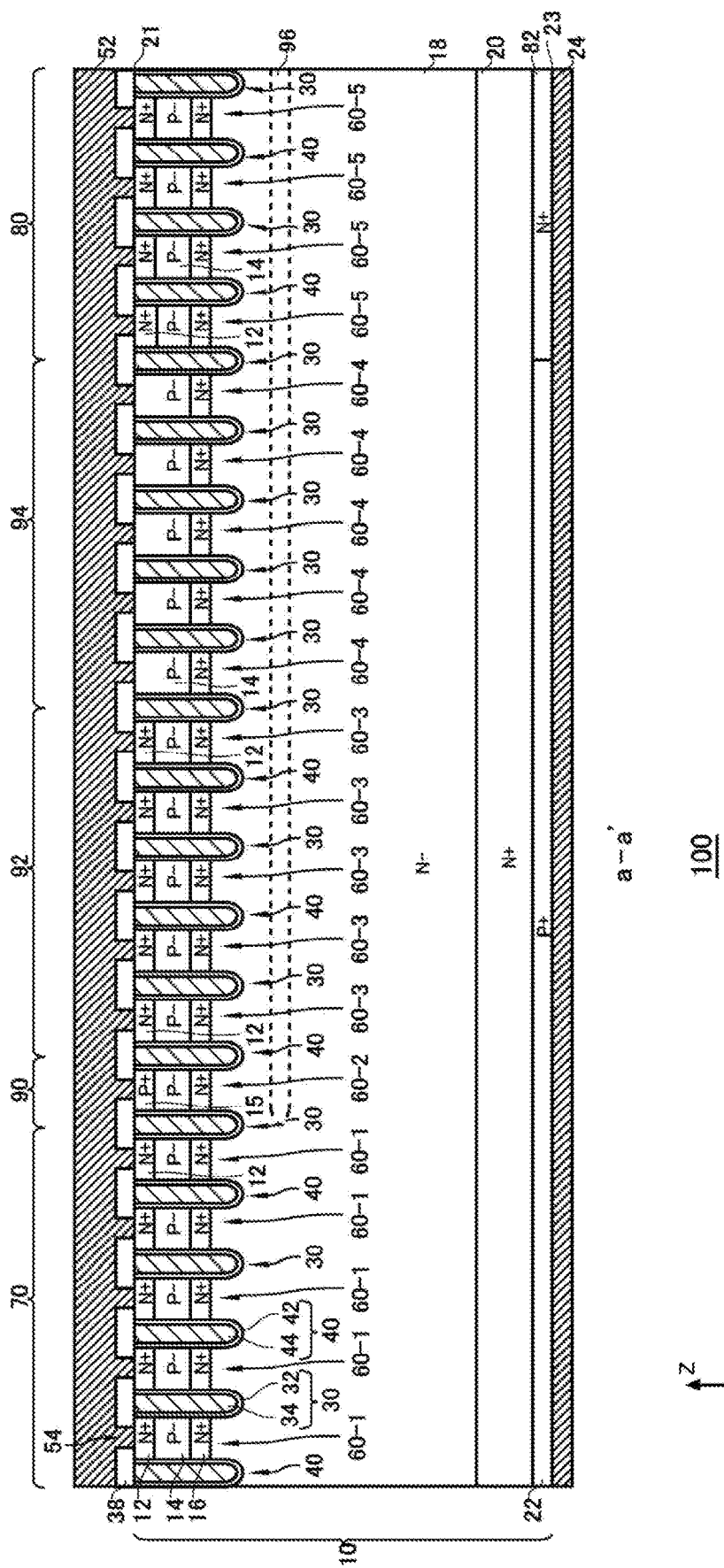
FIG. 17 is a diagram showing an example of the a-a' cross section in FIG. 16.

FIG. 17 is a diagram showing an example of the a-a' cross section in FIG. 16. The cross section is a cross section passing through the emitter region 12 of the diode portion 80. In the cross section, each mesa portion 60-5 of the diode portion 80 has the same structure as the mesa portion 60-1 of the transistor portion 70. As an example, the emitter region 12, the base region 14, the accumulation region 16 and the drift region 18 are arranged in order from the upper surface 21 in the mesa portion 60-5.

When the diode portion 80 is turned on with the on voltage applied to the gate trench portion 40, electrons injected from the cathode region 82 most easily pass through the channel immediately above in the Z-axis direction. Therefore, the electrons injected from the cathode region 82 hardly escape in the direction of the transistor portion 70. Therefore, electrons reaching the base region 14 of the diode portion 80 can be increased, the conductivity modulation can be sufficiently generated, and the forward recovery voltage can be further reduced. In addition, the hole implantation efficiency can be further suppressed, and the reverse recovery peak current of the diode portion 80 can be suppressed.

Figure 18:
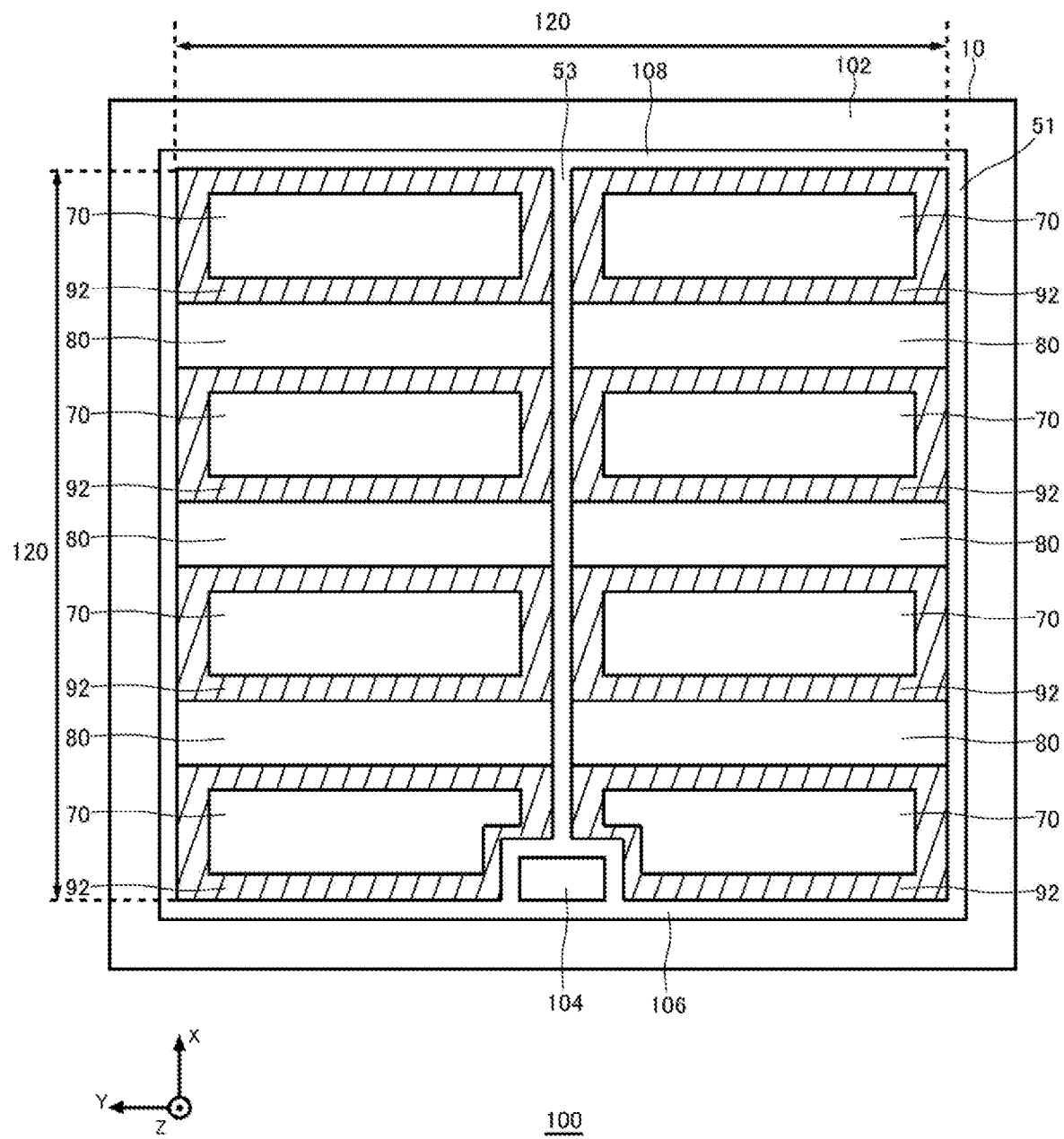
FIG. 18 is a diagram showing another example of the upper surface of the semiconductor device 100.

FIG. 18 is a diagram showing another example of the upper surface of the semiconductor device 100. In the example, the boundary portion 92 is arranged so as to surround the transistor portion 70 in top view. At least one transistor portion 70 may be surrounded by the boundary portion 92, or all the transistor portions 70 may be surrounded by the boundary portion 92. With such a configuration, the saturation current density at the boundary between the transistor portion 70 and the diode portion 80 can be reduced, and the current crowding at the boundary when a short circuit occurs can be relaxed.

The gate runner portion 51 provided outside the active portion 120 has a side 106 to which the gate pad 104 is connected and a side 108 opposite to the side 106. Each side may be arranged in parallel with the outer periphery of the semiconductor substrate 10.

The active inner wiring portion 53 of the example crosses the active portion 120 from the side 106 to the side 108. The active inner wiring portion 53 of the example extends in the X-axis direction and crosses the active portion 120. A plurality of transistor portions 70 and a plurality of diode portions 80 are alternately arranged along the X-axis direction. In addition, the transistor portions 70 are arranged at both ends of the active portion 120 in the X-axis direction. The transistor portion 70 may also be surrounded by the boundary portion 92.

In the example shown in FIG. 18 and thereafter, the extraction portion 90 and the suppression portion 94 are omitted. In the example shown in FIG. 18 and thereafter, the semiconductor device 100 may include at least one of the extraction portion 90 and the suppression portion 94 between the diode portion 80 and the transistor portion 70. The extraction portion 90 and the suppression portion 94 may be provided to surround the diode portion 80. In addition, the extraction portion 90 and the suppression portion 94 may be provided to surround the transistor portion 70.

Figure 19:
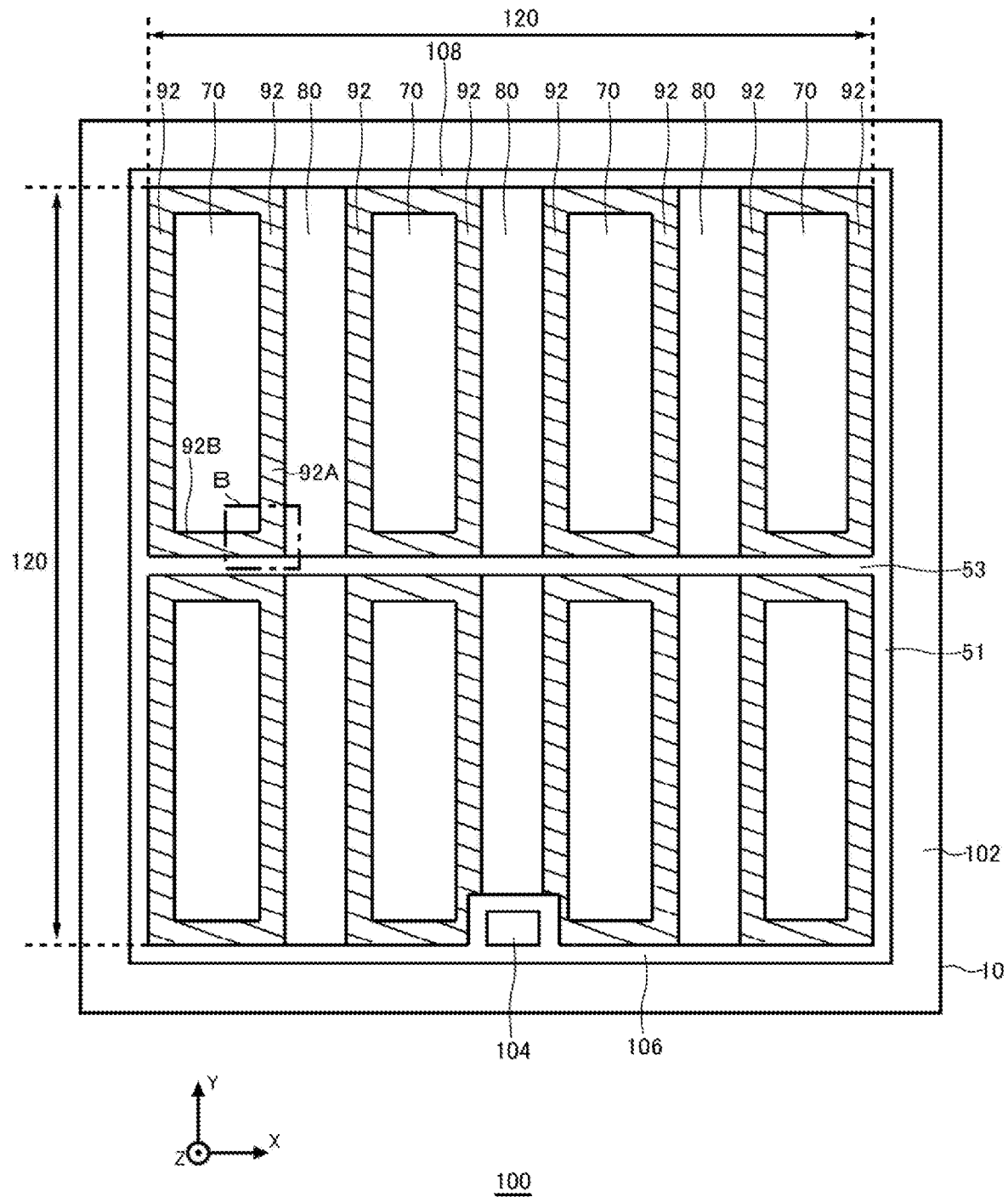
FIG. 19 is a diagram showing another example of the upper surface of the semiconductor device 100.

FIG. 19 is a diagram showing another example of the upper surface of the semiconductor device 100. The arrangement of the gate pad 104 in the semiconductor device 100 of the example is different from that of the example shown in FIG. 18. The other structures are the same as those of the examples shown in FIG. 18.

In the example, the straight line connecting the side 106 to which the gate pad 104 is connected and the side 108 opposite to the side 106 is orthogonal to the direction in which the active inner wiring portion 53 crosses the active portion 120. That is, the active inner wiring portion 53 extends in the direction (the X-axis direction) parallel to the side 106.

Figure 20:
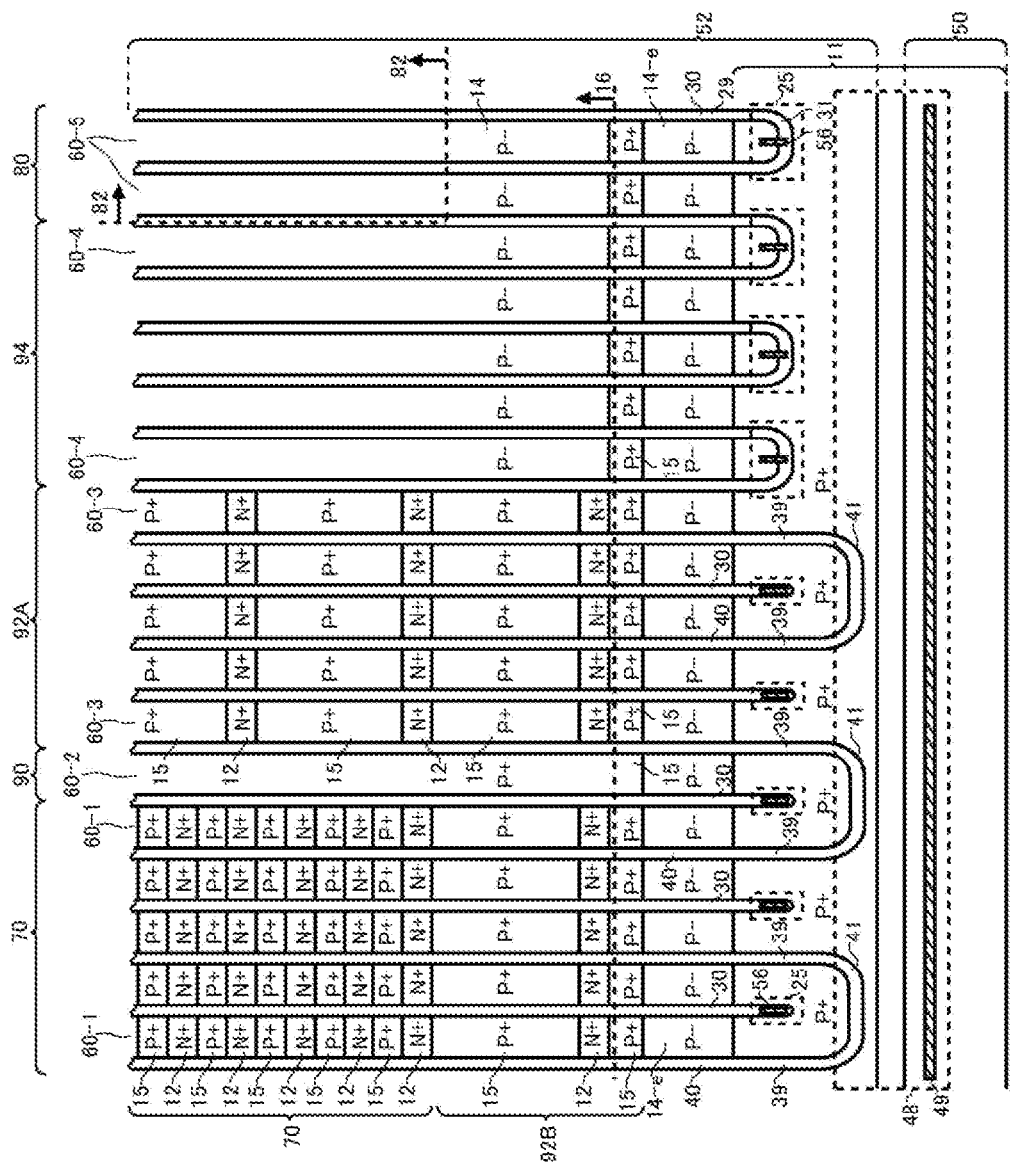
FIG. 20 is an enlarged view of a region B in FIG. 19.

FIG. 20 is an enlarged view of the region B in FIG. 19. In FIG. 20, the contact hole 54 is omitted. In the top view in this specification, the contact hole 54 may be omitted. The region B is a region including the active inner wiring portion 53. The active inner wiring portion 53 has the gate metal layer 50 and the gate runner 48.

The region B includes a boundary portion 92A in contact with transistor portion 70 in the X-axis direction and a boundary portion 92B in contact with transistor portion 70 in the Y-axis direction. In the example, the boundary portion 92A is arranged between the transistor portion 70 and the diode portion 80, and the boundary portion 92B is arranged between the transistor portion 70 and the gate runner portion 51 (in the example, the active inner wiring portion 53).

The boundary portion 92B may be provided in the mesa portion 60-1 common to the transistor portion 70. That is, the mesa portion 60-1 may have a region of the transistor portion 70 with a high channel density and a region of the boundary portion 92B with a channel density lower than that of the transistor portion 70. The channel density of the boundary portion 92B may be identical to or different from the channel density of the boundary portion 92A. In any of the boundary portion 92A and the boundary portion 92B, the interval in the Y-axis direction at which the emitter regions 12 are provided may be larger than the interval between the emitter regions 12 in the transistor portion 70.

As shown in FIG. 20, the extraction portion 90 may be provided between the transistor portion 70 and the boundary portion 92. The extraction portion 90 may be provided between the transistor portion 70 and the boundary portion 92 in the X-axis direction. The extraction portion 90 may not be provided between the transistor portion 70 and the boundary portion 92 in the Y-axis direction.

Figure 21:
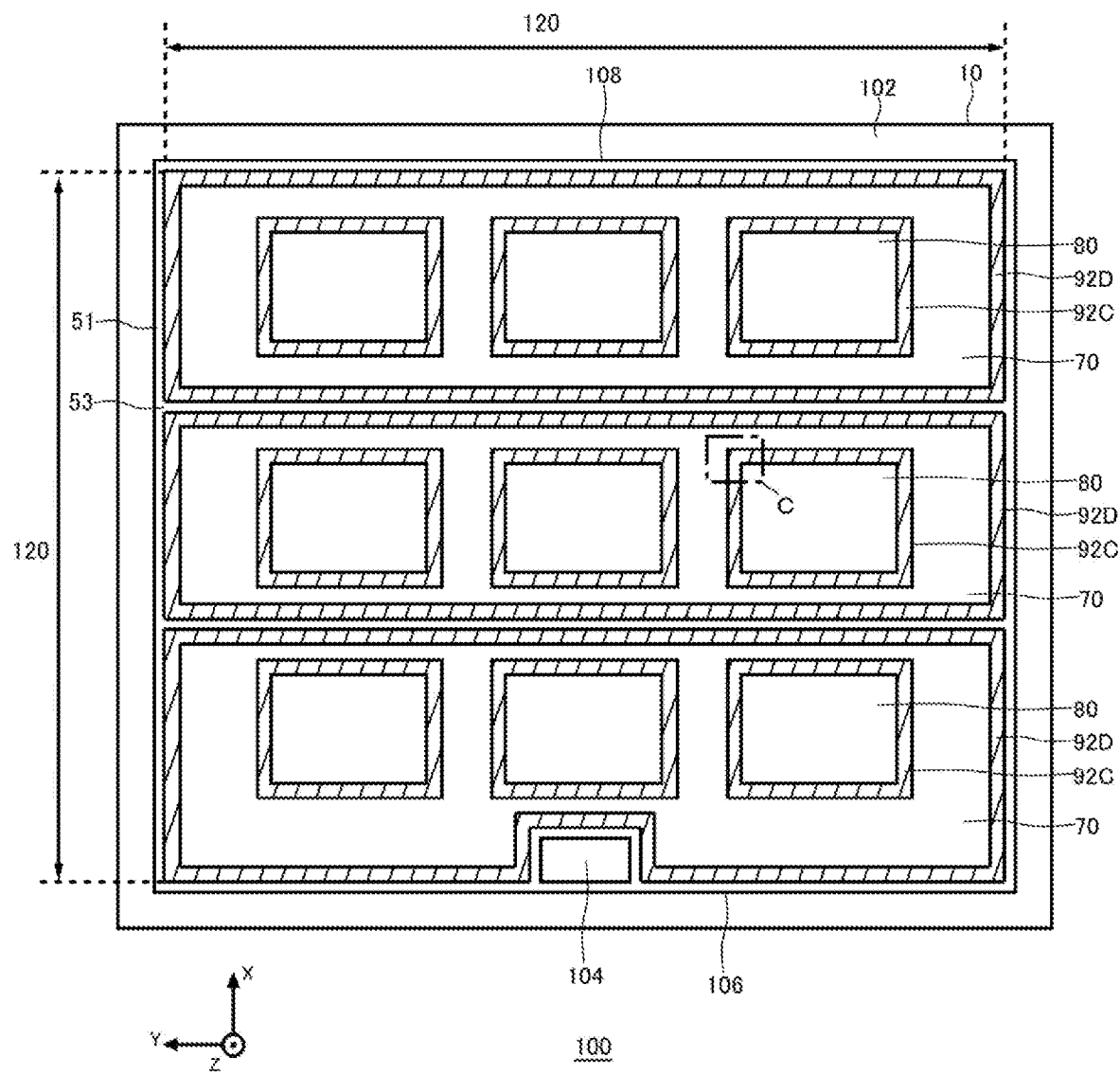
FIG. 21 shows another example of the upper surface of the semiconductor device 100.

FIG. 21 is a diagram showing another example of the upper surface of the semiconductor device 100. The semiconductor device 100 of the example is different from the semiconductor device 100 described in FIGS. 1A to 20 in that the diode portion 80 is surrounded by the transistor portion 70 in top view. The other structures may be identical to those of the semiconductor device 100 of any one of the aspects described in FIGS. 1A to 20.

Also in the example, a boundary portion 92C is provided at the boundary between the transistor portion 70 and the diode portion 80. The boundary portion 92C of the example surrounds the diode portion 80 in top view. The boundary portion 92C may be in contact with or away from the diode portion 80. At least one of the extraction portion 90 and the suppression portion 94 may be provided between the diode portion 80 and the transistor portion 70.

The boundary portion 92C is surrounded by the transistor portion 70 in top view. The transistor portion 70 may be in contact with or away from the boundary portion 92C. In addition, the transistor portion 70 may be surrounded by a boundary portion 92D in top view. The boundary portion 92D of the example is provided between the transistor portion 70 and the gate runner portion 51 or the transistor portion 70 and the active inner wiring portion 53.

A plurality of diode portions 80 surrounded by the transistor portion 70 may be provided in top view. The diode portions 80 may be periodically arranged along the Y-axis direction, or may be periodically arranged along the X-axis direction. The active inner wiring portion 53 of the example extends in the Y-axis direction and crosses the active portion 120.

Further, in the example of FIG. 21, the gate pad 104 is in contact with the side 106 extending in the Y-axis direction among the sides of the gate runner portion 51. In another example, the gate pad 104 may be in contact with a side extending in the X-axis direction among the sides of the gate runner portion 51.

Figure 22:
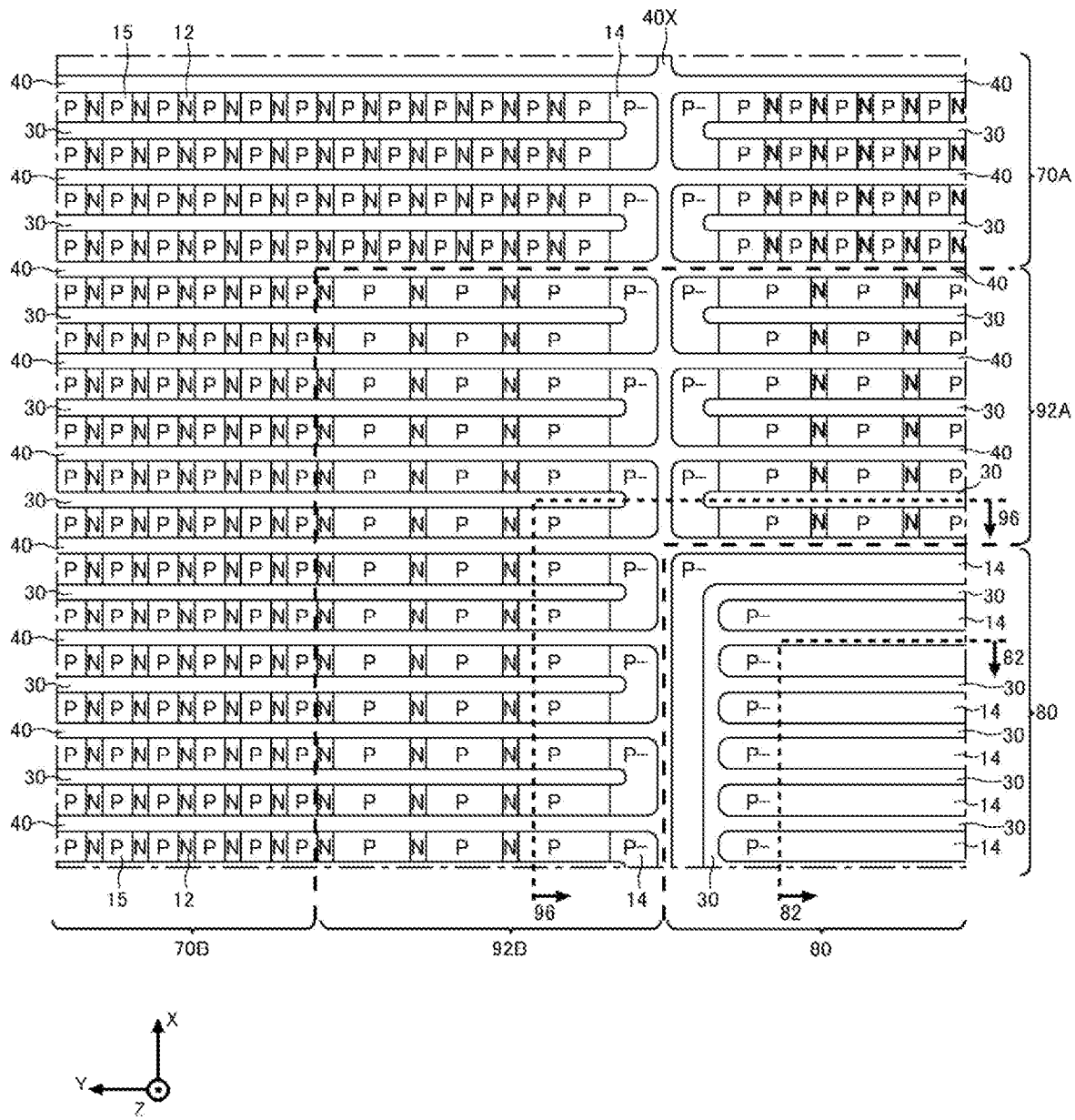
FIG. 22 is an enlarged view of a region C in FIG. 21.

FIG. 22 is an enlarged view of a region C in FIG. 21. In FIG. 22, the conductivity type of the emitter region 12 is indicated as "N", and the conductivity type of the contact region 15 is indicated as "P". The doping concentrations of the emitter region 12 and the contact region 15 are the same as those described in FIGS. 1A to 20.

The region C is a region near the corner of the diode portion 80. In the diode portion 80, the base region 14 may be provided in a annular shape at the upper surface of the region in contact with the boundary portion 92 in top view. The dummy trench portion 30 and the cathode region 82 may be arranged in a region surrounded by the annular base region 14. The dummy trench portion 30 may be annularly arranged in contact with the annular base region 14.

The boundary portion 92A in contact with the diode portion 80 in the X-axis direction and the boundary portion 92B in contact with the diode portion 80 in the Y-axis direction are arranged in the region C. The boundary portion 92A extends along the extending direction (the Y-axis direction) of the trench portion, and the boundary portion 92B extends along the arrangement direction (the X-axis direction) of the trench portion. The boundary portion 92A and the boundary portion 92B may be connected at intersection points in the respective extending directions.

A gate trench portion 40X extending in the X-axis direction may be arranged between the boundary portion 92B and the diode portion 80. The gate trench portion 40X may be connected to the respective gate trench portions 40 extending in the Y-axis direction at intersection points. Connecting the two gate trench portions 40 refers to connecting the gate conductive portions 44 of the two gate trench portions 40. The gate trench portion 40X is connected to the gate runner portion 51 such as the active inner wiring portion 53.

The gate trench portion 40X separates the dummy trench portion 30 extending in the Y-axis direction, each mesa portion, and the contact hole 54 (not shown in FIG. 22). In each mesa portion, the base region 14 may be provided on the upper surface of the region in contact with the gate trench portion 40X.

A transistor portion 70A in contact with the boundary portion 92A in the X-axis direction and a transistor portion 70B in contact with the boundary portion 92B in the Y-axis direction are arranged in the region C. The transistor portion 70A extends along the extending direction (the Y-axis direction) of the trench portion, and the transistor portion 70B extends along the arrangement direction (the X-axis direction) of the trench portions. The transistor portion 70A and the transistor portion 70B may be connected at respective intersection points in the respective extending directions.

The emitter region 12 and the contact region 15 of the transistor portion 70B and the emitter region 12 and the contact region 15 of the boundary portion 92B are provided in the common mesa portion 60. In the mesa portion 60, the channel density of the boundary portion 92B is smaller than the channel density of the transistor portion 70B. In the example, in the common mesa portion 60, the interval at which the emitter regions 12 in the region of the boundary portion 92B are arranged is different from the interval at which the emitter regions 12 in the region of the transistor portion 70B are arranged. The gate trench portion 40X is not arranged between the boundary portion 92B and the transistor portion 70B.

In FIG. 22, the range in which the upper surface side lifetime control portion 96 is provided is indicated by a broken line. The end of the upper surface side lifetime control portion 96 in top view may be arranged in the boundary portion 92 between the transistor portion 70 and the diode portion 80. The end of the lower surface side lifetime control portion 98 in top view may also be arranged in the boundary portion 92.

As described in FIGS. 18 to 22, by surrounding at least one of the transistor portion 70 and the diode portion 80 with the boundary portion 92, the saturation current density at the boundary between the transistor portion 70 and the diode portion 80 can be reduced. Therefore, the current crowding at the boundary when a short circuit occurs can be relaxed.

While the embodiments of the present invention have been described, the technical scope of the invention is not limited to the above described embodiments. It is apparent to persons skilled in the art that various alterations and improvements can be added to the above-described embodiments. It is also apparent from the description of the claims that the embodiments to which such alterations or improvements are added can be included in the technical scope of the invention.

REFERENCE SIGNS LIST 10 semiconductor substrate
11 well region
12 emitter region
13 narrowed portion
14 base region
15 contact region
16 accumulation region
17 channel portion
18 drift region
20 buffer region
21 upper surface
22 collector region
23 lower surface
24 collector electrode
25 connection portion
29 linear portion
30 dummy trench portion
31 edge portion
32 dummy dielectric film
34 dummy conductive portion
38 interlayer dielectric film
39 linear portion
40 gate trench portion
41 edge portion
42 gate dielectric film
43 side wall
44 gate conductive portion
48 gate runner
49 contact hole
50 gate metal layer
51 gate runner portion
52 emitter electrode
53 active inner wiring portion
54 contact hole
56 contact hole
60 mesa portion
70 transistor portion
80 diode portion
82 cathode region
90 extraction portion
92 boundary portion
94 suppression portion
96 upper surface side lifetime control portion
97 end
98 lower surface side lifetime control portion
99 end
100 semiconductor device
102 edge termination structure
104 gate pad
106 side
108 side
110 space charge region
120 active portion
200 semiconductor device
202 depletion layer

What is claimed is:
1. A semiconductor device comprising:
a semiconductor substrate having a drift region of a first conductivity type;

a transistor portion formed on the semiconductor substrate and having a collector region of a second conductivity type;

a diode portion formed on the semiconductor substrate and having a cathode region of a first conductivity type; and a boundary portion formed on the semiconductor substrate, arranged between the transistor portion and the diode portion at an upper surface of the semiconductor substrate, and having the collector region, wherein each of the transistor portion and the boundary portion includes trench portions each having a longitudinal direction at the upper surface of the semiconductor substrate, the trench portions including one or more gate trench portions provided from the upper surface of the semiconductor substrate to an inside of the semiconductor substrate, and a mesa portion sandwiched between two of the trench portions, wherein the mesa portion of each of the transistor portion and the boundary portion has an emitter region having a doping concentration higher than a doping concentration of the drift region, and a base region of a second conductivity type which is provided between the drift region and the upper surface of the semiconductor substrate, and wherein the base region has a formed channel portion which is a portion in which the base region is in contact with the gate trench portion in the mesa portion which is provided with an emitter region on the upper surface of the semiconductor substrate, and a total sum of the area of the emitter region in the boundary portion is smaller than a total sum of the area of the emitter region in the transistor portion.

2. The semiconductor device according to claim 1, wherein a plurality of the emitter regions and a plurality of second conductivity type regions are alternately arranged along a longitudinal direction of the trench portions at an upper surface of the mesa portion of each of the transistor portion and the boundary portion, and wherein a length of the second conductivity type regions of the boundary portion in the longitudinal direction of the trench portions is larger than a length of the second conductivity type regions of the transistor portion in the longitudinal direction of the trench portions.

3. The semiconductor device according to claim 2, wherein a length of the one emitter region of the transistor portion in the longitudinal direction of the trench portions is identical to a length of the one emitter region of the boundary portion in the longitudinal direction of the trench portions.

4. The semiconductor device according to claim 2, wherein a length of the one emitter region of the boundary portion in the longitudinal direction of the trench portions is smaller than a length of the one emitter region of the transistor portion in the longitudinal direction of the trench portions.

5. The semiconductor device according to claim 2, wherein at the upper surface of the semiconductor substrate, the emitter region of the boundary portion is arranged at a position facing the emitter region of the transistor portion.

6. The semiconductor device according to claim 2, wherein at the upper surface of the semiconductor substrate, the emitter region of the boundary portion is arranged at a position facing the second conductivity type region of the transistor portion.

7. The semiconductor device according to claim 2, wherein the emitter region arranged at a most end in the longitudinal direction of the trench portions of a plurality of the emitter regions in the mesa portion of the boundary portion is arranged closer to a center of the mesa portion in the longitudinal direction than the emitter region arranged at a most end in the longitudinal direction of the trench portions of the emitter regions in the mesa portion of the transistor portion.

8. The semiconductor device according to claim 2, further comprising a suppression portion formed on the semiconductor substrate, arranged between the diode portion and the boundary portion at the upper surface of the semiconductor substrate, and having the collector region, wherein the suppression portion includes the mesa portion, and wherein the mesa portion of the suppression portion has, at the upper surface, a second conductivity type region having a doping concentration lower than a doping concentration of the second conductivity type regions of the transistor portion.

9. The semiconductor device according to claim 1, wherein at the upper surface of the mesa portion of the transistor portions, the one emitter region in contact with the gate trench portions is provided continuously along the longitudinal direction of the trench portions, and wherein at the upper surface of the mesa portion of the boundary portions, a plurality of the emitter regions in contact with the gate trench portions is provided discretely along the longitudinal direction of the trench portions.

10. The semiconductor device according to claim 1, further comprising a first extraction portion formed on the semiconductor substrate, arranged between the transistor portion and the boundary portion at the upper surface of the semiconductor substrate, and having the collector region, wherein the first extraction portion includes the mesa portion, and wherein the mesa portion of the first extraction portion has a contact region of a second conductivity type at the upper surface, and does not have a region of a first conductivity type at the upper surface.

11. The semiconductor device according to claim 1, further comprising an second extraction portion formed on the semiconductor substrate, arranged between the diode portion and the boundary portion at the upper surface of the semiconductor substrate, and having the collector region, wherein the second extraction portion includes the mesa portion, and wherein the mesa portion of the second extraction portion has a contact region of a second conductivity type at the upper surface, and does not have a region of a first conductivity type at the upper surface.

12. The semiconductor device according to claim 1, wherein the boundary portion has two or more of the mesa portions, and wherein as a mesa portion in each of the mesa portions of the boundary portion is closer to the diode portion, the total sum of the area of the emitter region in the boundary portion is smaller.

13. The semiconductor device according to claim 1, wherein the total sum of the area of the emitter region in the boundary portion is 10% or more and 90% or less of the total sum of the area of the emitter region in the transistor portion.

14. The semiconductor device according to claim 1, wherein the diode portion includes the trench portion including one or more of the gate trench portions and the mesa portion, and wherein the mesa portion of the diode portion has an emitter region having a doping concentration higher than a doping concentration of the drift region.

15. The semiconductor device according to claim 1, wherein the boundary portion is arranged so as to surround the transistor portion at the upper surface of the semiconductor substrate.

16. The semiconductor device according to claim 1, wherein at the upper surface of the semiconductor substrate, a plurality of the boundary portions surrounds the diode portion and is periodically arranged, and wherein the transistor portion is arranged between the boundary portions surrounding the diode portion.

17. The semiconductor device according to claim 1, wherein at the upper surface of the mesa portion of each of the transistor portion and the boundary portion, a contact region of a second conductivity type in contact with the two trench portions sandwiching the mesa portion is provided, wherein the emitter region is provided in contact with the two trench portions sandwiching the mesa portion, wherein in top view, a plurality of the emitter regions of the two adjacent mesa portions of the transistor portion is provided adjacent to each other, and wherein in top view, the contact region of the boundary portion is arranged on a straight line passing through the plurality of emitter regions arranged adjacent to each other of the transistor portion.

18. The semiconductor device according to claim 17, wherein the mesa portion has a base region of a second conductivity type having a doping concentration lower than a doping concentration of the contact region, and wherein the emitter region and the contact region are provided at an upper surface of the base region.

19. The semiconductor device according to claim 17, wherein the trench portion has an edge in the longitudinal direction, and wherein any one of a plurality of the contact regions in the mesa portion of the transistor portion has a larger length in the longitudinal direction than the contact region arranged farther away from the edge of the trench portion than the any one contact region.

20. The semiconductor device according to claim 1, wherein the total sum of the area of the emitter region in the boundary portion and the total sum of the area of the emitter region in the transistor portion are measured on a plane along the longitudinal direction of the trench portions.

* * * * *